United States Patent
Gerber

(10) Patent No.: US 11,862,587 B2
(45) Date of Patent: Jan. 2, 2024

(54) SEMICONDUCTOR PACKAGE STRUCTURE AND METHOD OF MANUFACTURING THE SAME

(71) Applicant: Advanced Semiconductor Engineering, Inc., Kaohsiung (TW)

(72) Inventor: Mark Gerber, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 255 days.

(21) Appl. No.: 16/937,493

(22) Filed: Jul. 23, 2020

(65) Prior Publication Data

US 2021/0028134 A1    Jan. 28, 2021

Related U.S. Application Data

(60) Provisional application No. 62/878,593, filed on Jul. 25, 2019.

(51) Int. Cl.
| | |
|---|---|
| *H01L 23/00* | (2006.01) |
| *H01L 21/56* | (2006.01) |
| *H01L 25/00* | (2006.01) |
| *H01L 25/18* | (2023.01) |

(52) U.S. Cl.
CPC .............. *H01L 24/05* (2013.01); *H01L 21/56* (2013.01); *H01L 24/11* (2013.01); *H01L 24/16* (2013.01); *H01L 24/24* (2013.01); *H01L 24/25* (2013.01); *H01L 24/32* (2013.01); *H01L 24/73* (2013.01); *H01L 24/92* (2013.01); *H01L 25/18* (2013.01); *H01L 25/50* (2013.01); *H01L 2224/02379* (2013.01); *H01L 2224/02381* (2013.01); *H01L 2224/11616* (2013.01); *H01L 2224/13084* (2013.01); *H01L 2224/13111* (2013.01); *H01L 2224/13144* (2013.01); *H01L 2224/13147* (2013.01); *H01L 2224/13155* (2013.01); *H01L 2224/13166* (2013.01); *H01L 2224/16148* (2013.01); *H01L 2224/24155* (2013.01); *H01L 2224/2518* (2013.01); *H01L 2224/25171* (2013.01); *H01L 2224/32145* (2013.01); *H01L 2224/73204* (2013.01); *H01L 2224/73209* (2013.01); *H01L 2224/92143* (2013.01)

(58) Field of Classification Search
CPC ......... H01L 21/56; H01L 24/11; H01L 24/24; H01L 24/25; H01L 24/32; H01L 24/73; H01L 24/92; H01L 25/18; H01L 25/50
See application file for complete search history.

(56) References Cited

U.S. PATENT DOCUMENTS

| | | |
|---|---|---|
| 8,476,770 B2 | 7/2013 | Shao et al. |
| 8,941,222 B2 | 1/2015 | Hunt |
| 9,768,133 B1 | 9/2017 | Wu et al. |

(Continued)

*Primary Examiner* — Jasmine J Clark
(74) *Attorney, Agent, or Firm* — FOLEY & LARDNER LLP

(57) ABSTRACT

A semiconductor package structure and a method of manufacturing the semiconductor package structure are disclosed. The semiconductor package structure includes a first semiconductor device having an active surface, a redistribution structure in electrical connection with the first semiconductor device, and a second semiconductor device bonded to the active surface of the first semiconductor device, and disposed between the first semiconductor device and the redistribution structure.

14 Claims, 41 Drawing Sheets

(56) References Cited

U.S. PATENT DOCUMENTS

| | | |
|---|---|---|
| 9,859,258 B2 | 1/2018 | Chen et al. |
| 10,217,716 B2 | 2/2019 | Yu et al. |
| 10,319,683 B2 | 6/2019 | Yu et al. |
| 10,504,835 B1 | 12/2019 | Wang et al. |
| 2005/0110163 A1* | 5/2005 | Koo .................. H01L 24/29 257/E21.511 |
| 2014/0117542 A1* | 5/2014 | Dohi .................. H01L 23/5389 257/737 |
| 2018/0025966 A1* | 1/2018 | Hwang ............. H01L 23/49827 257/737 |
| 2018/0294255 A1 | 10/2018 | Liu |
| 2019/0139952 A1* | 5/2019 | Chang ................ H01L 24/14 |
| 2020/0203282 A1* | 6/2020 | Shih .................. H01L 21/4853 |

* cited by examiner

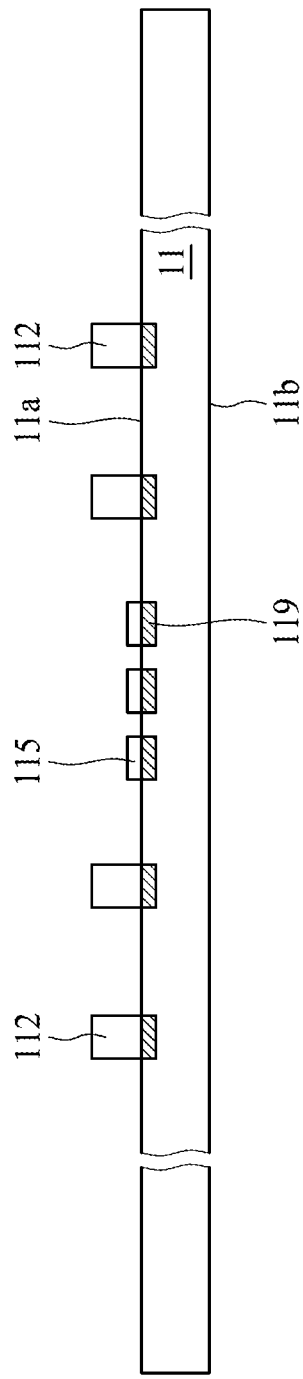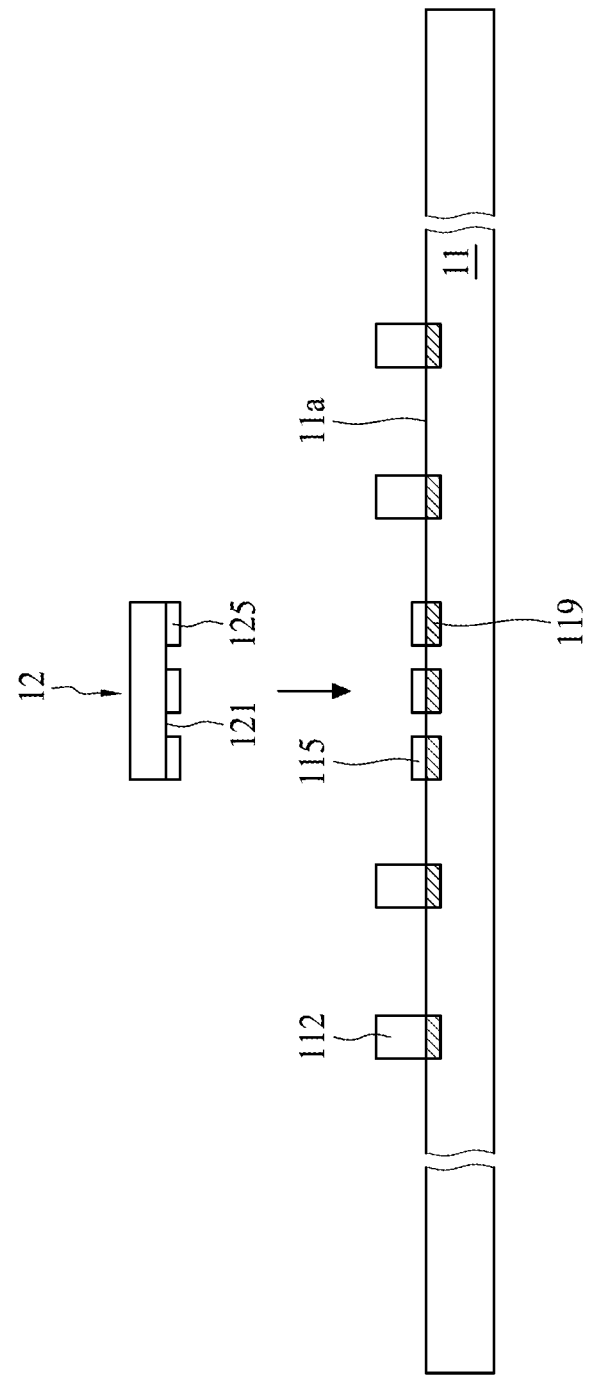

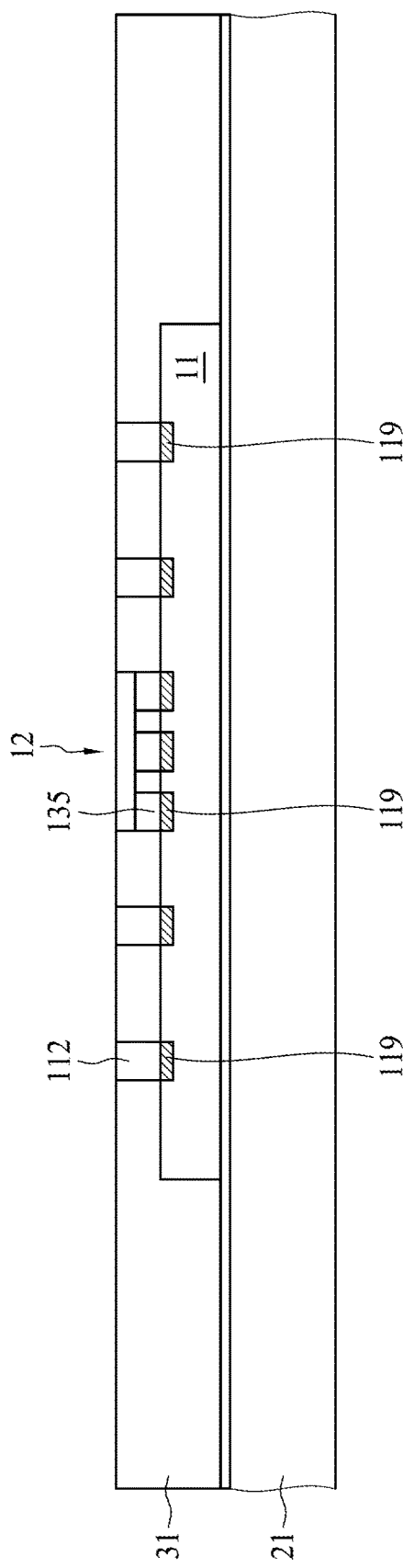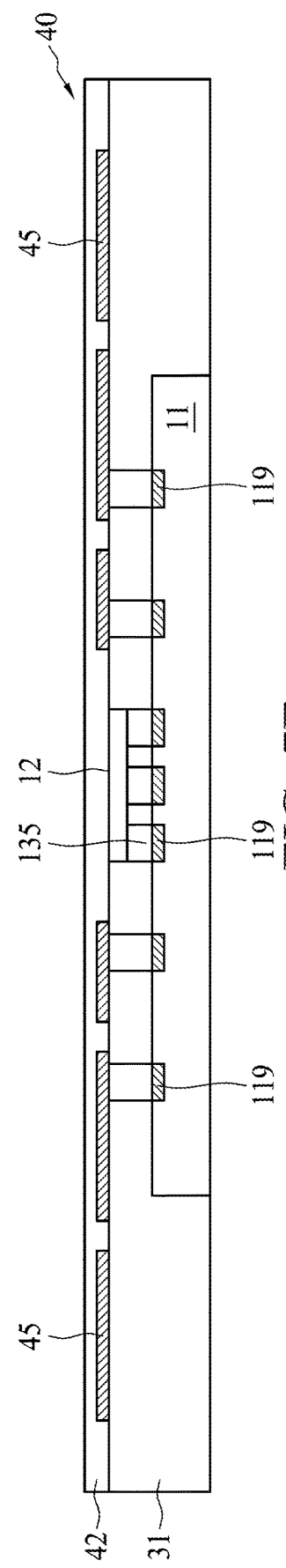

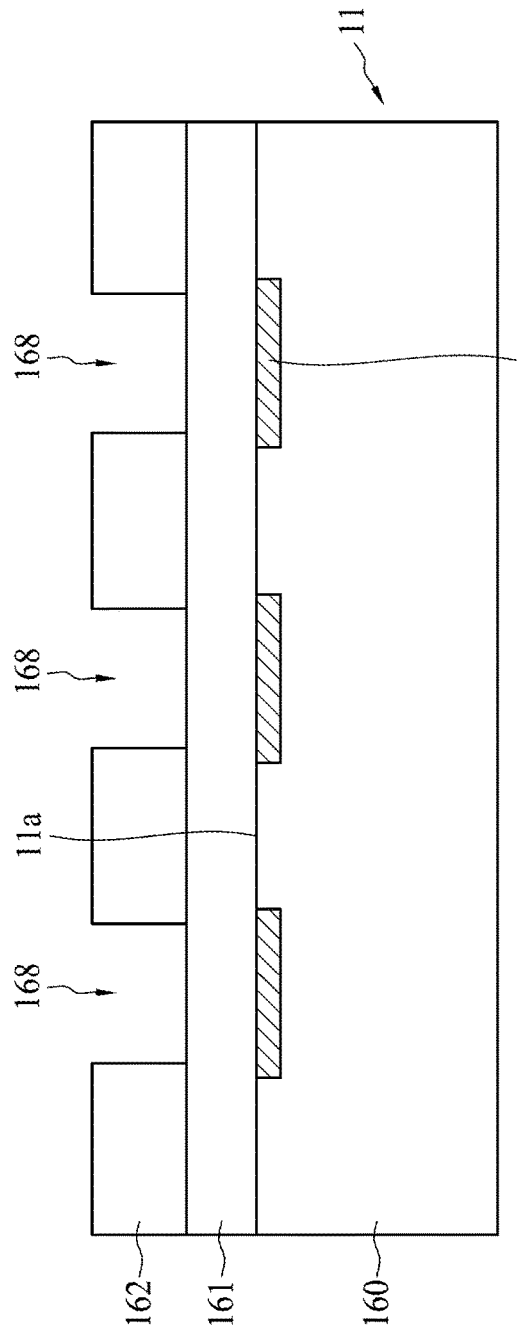
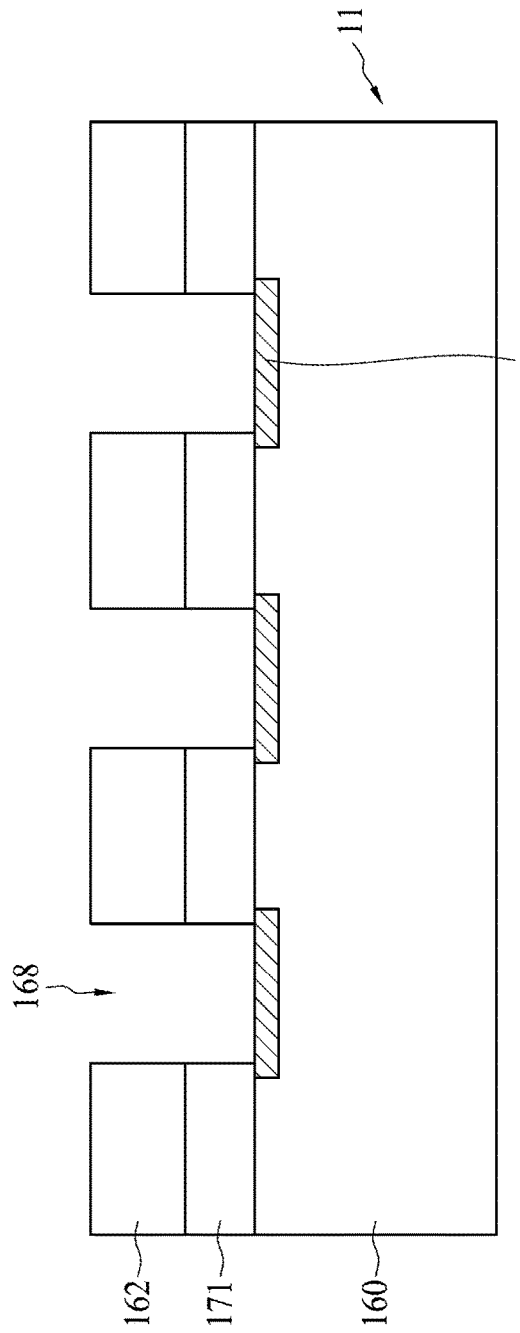

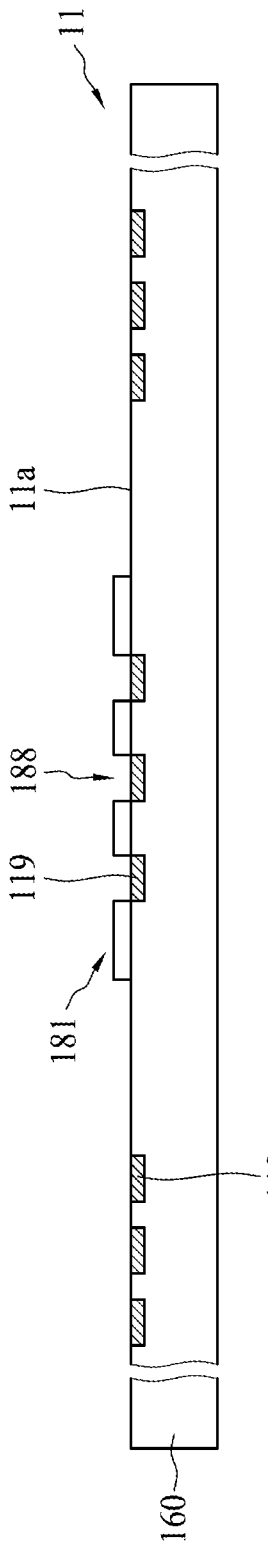
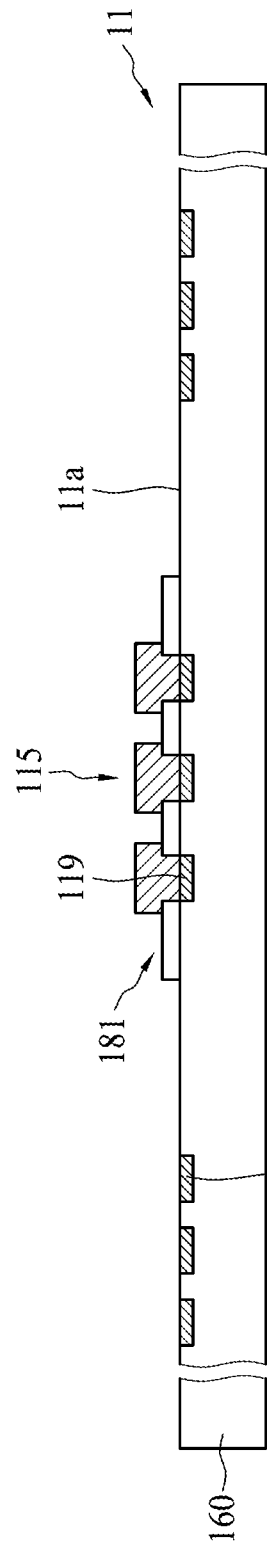

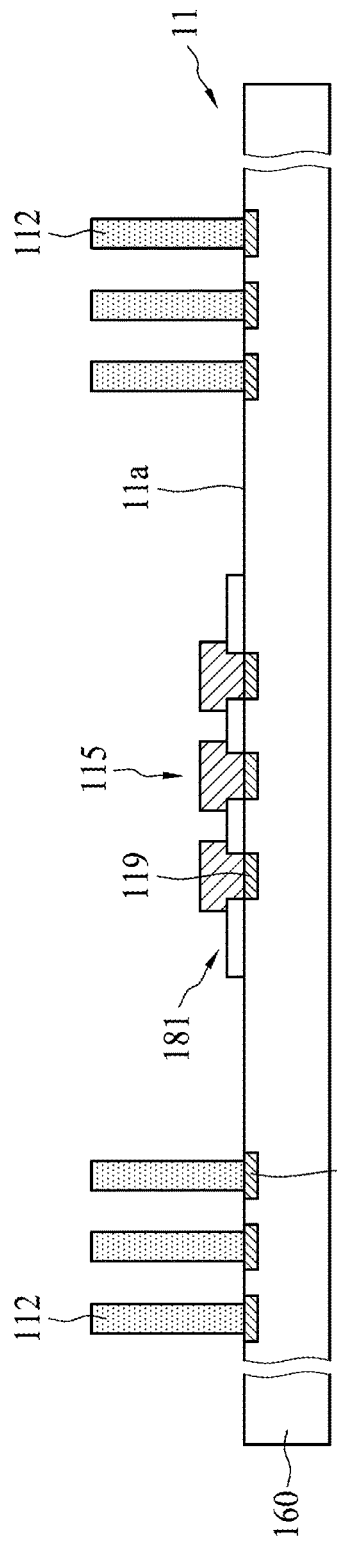
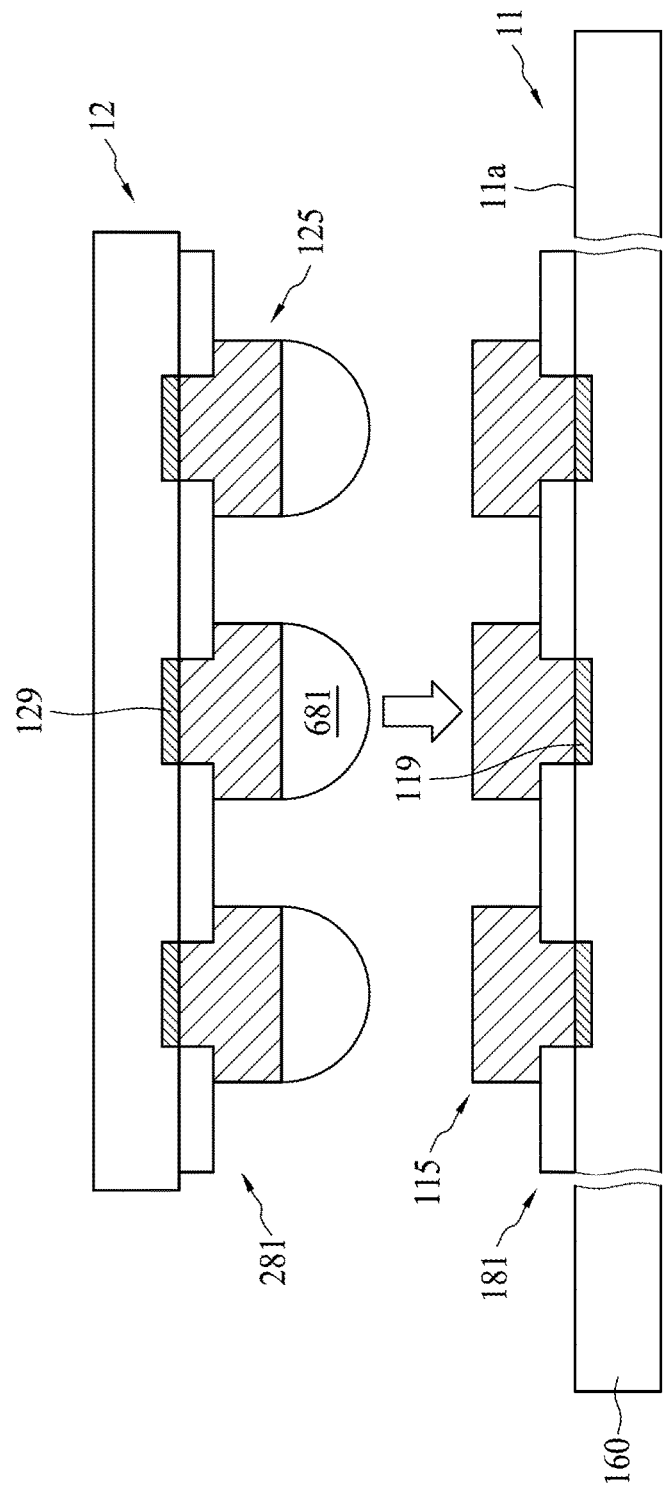

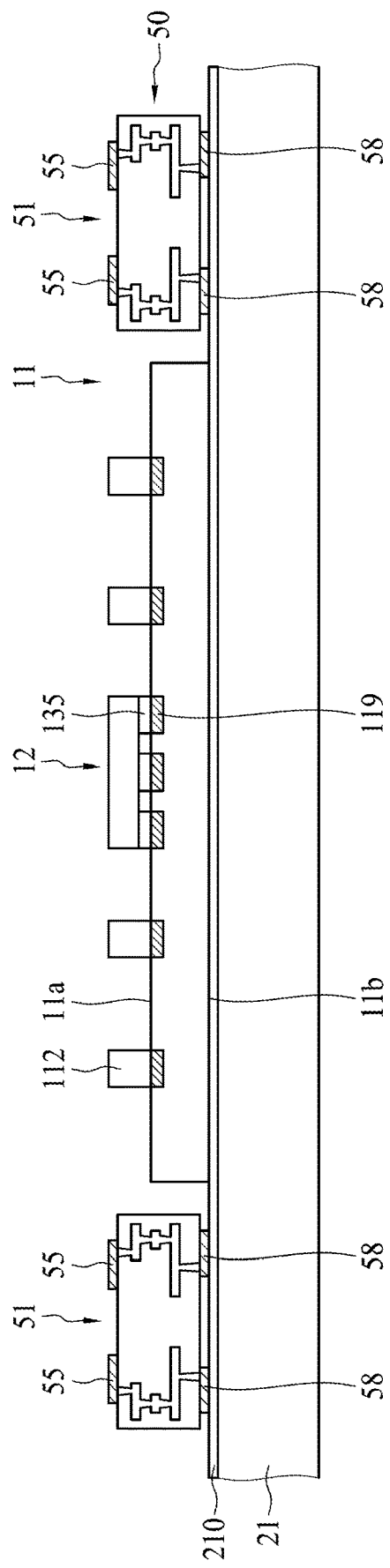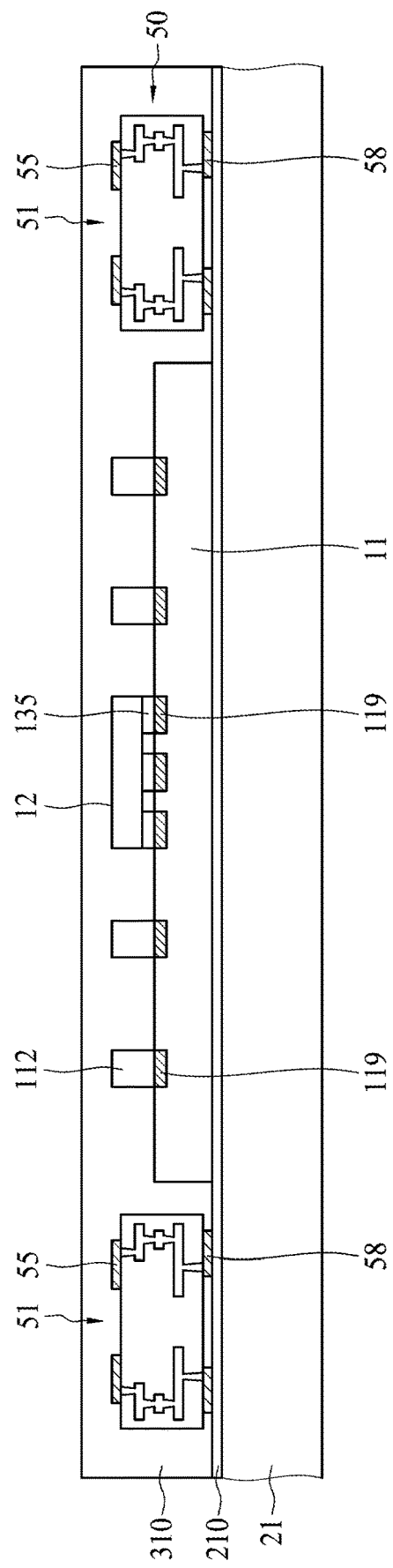

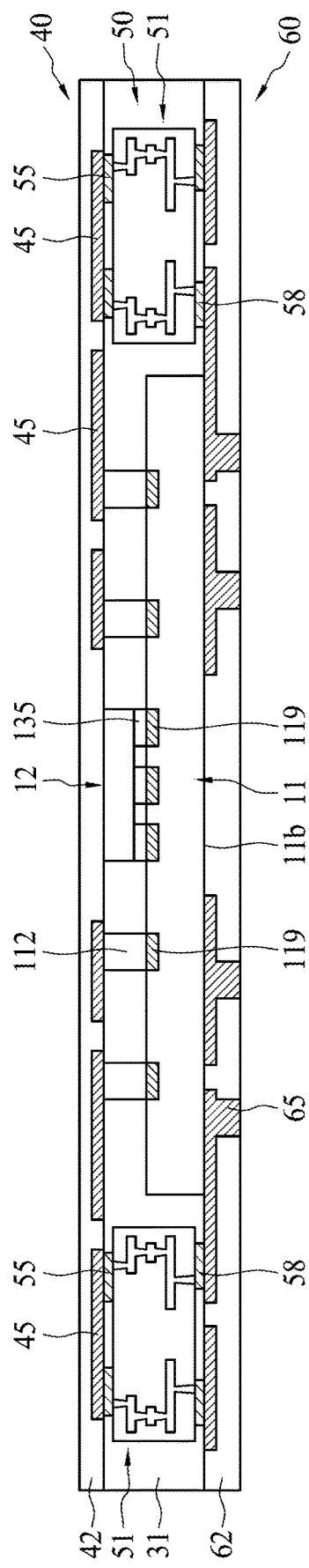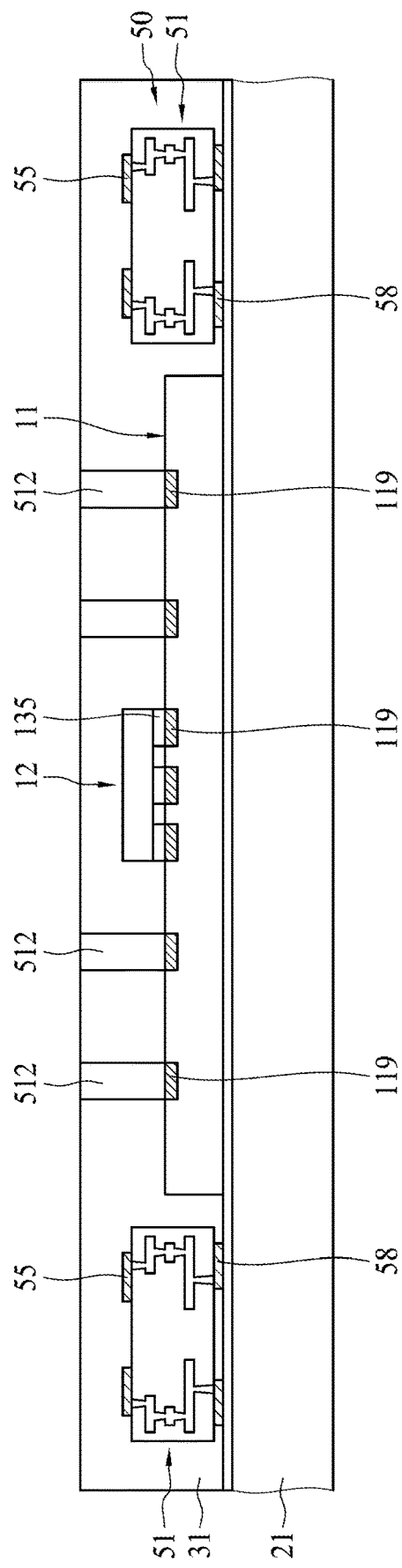

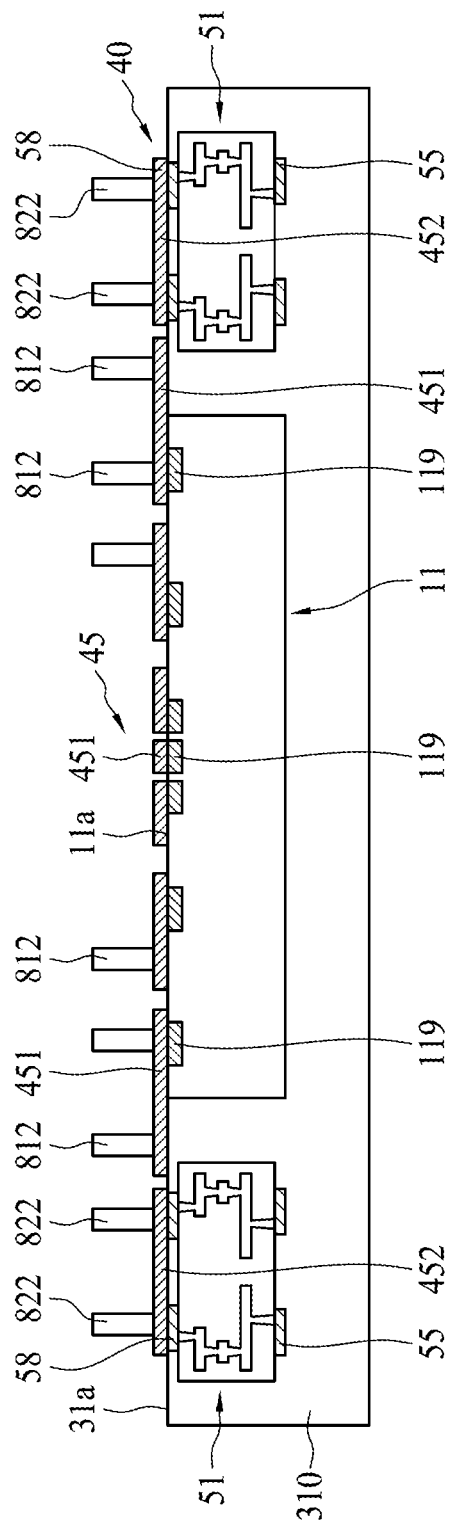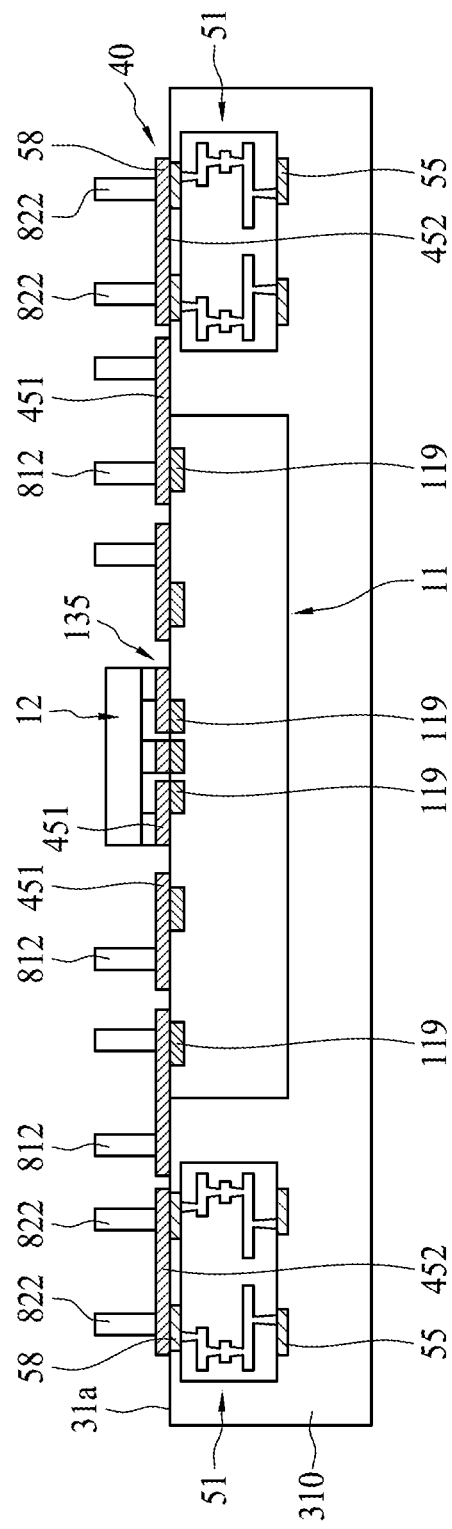

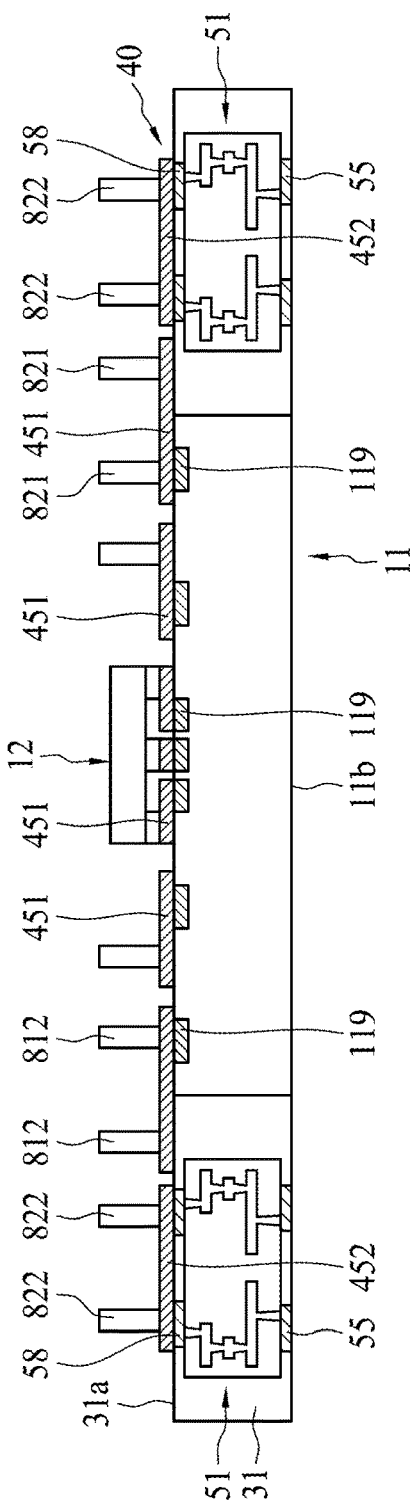
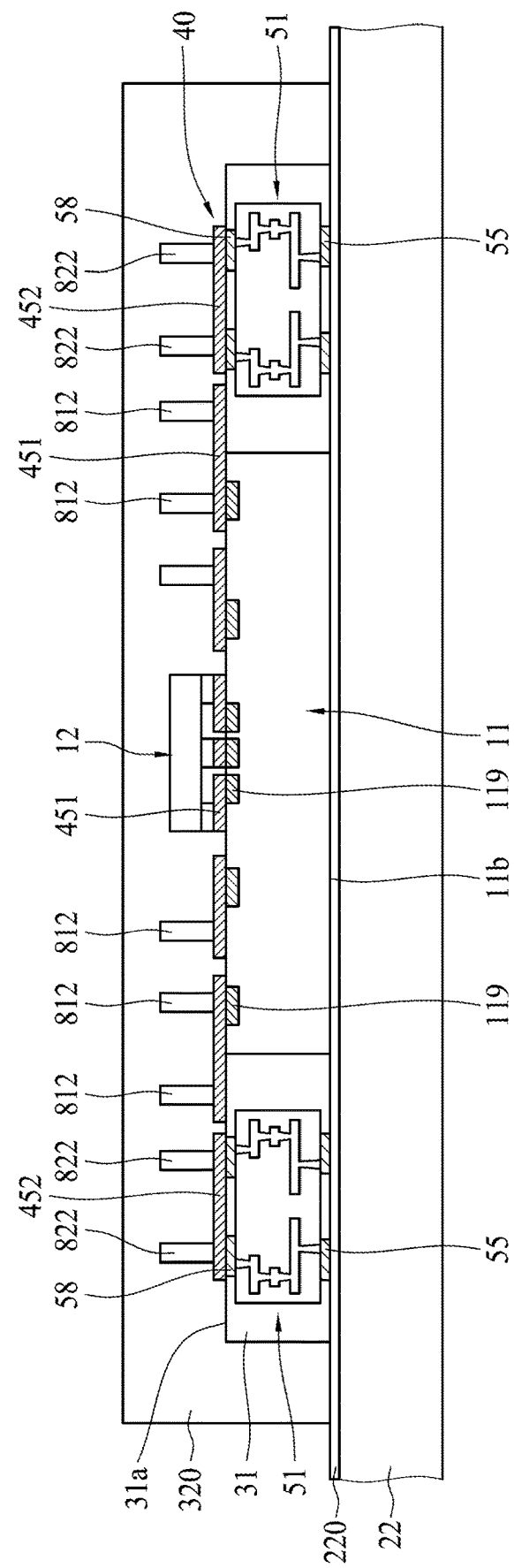

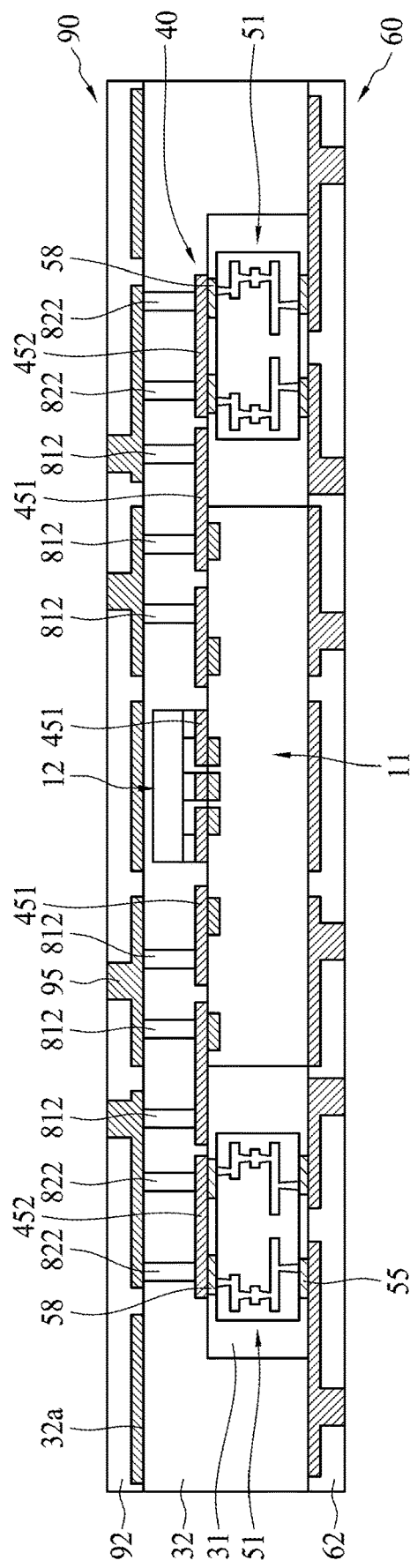
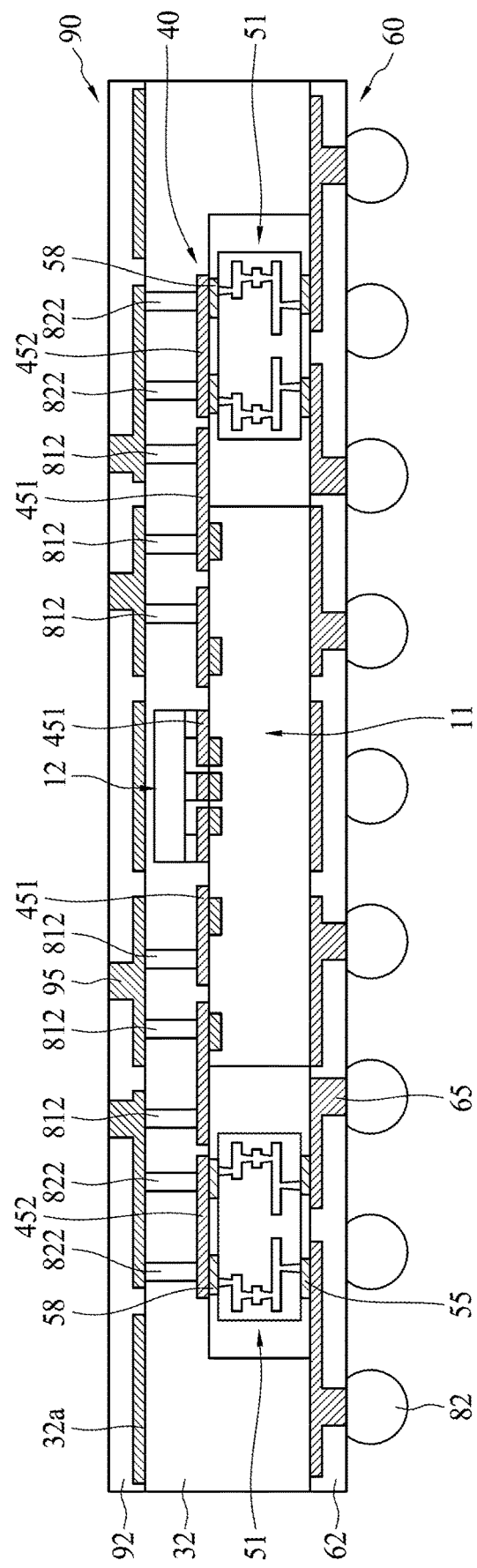
FIG. 14I
FIG. 14J

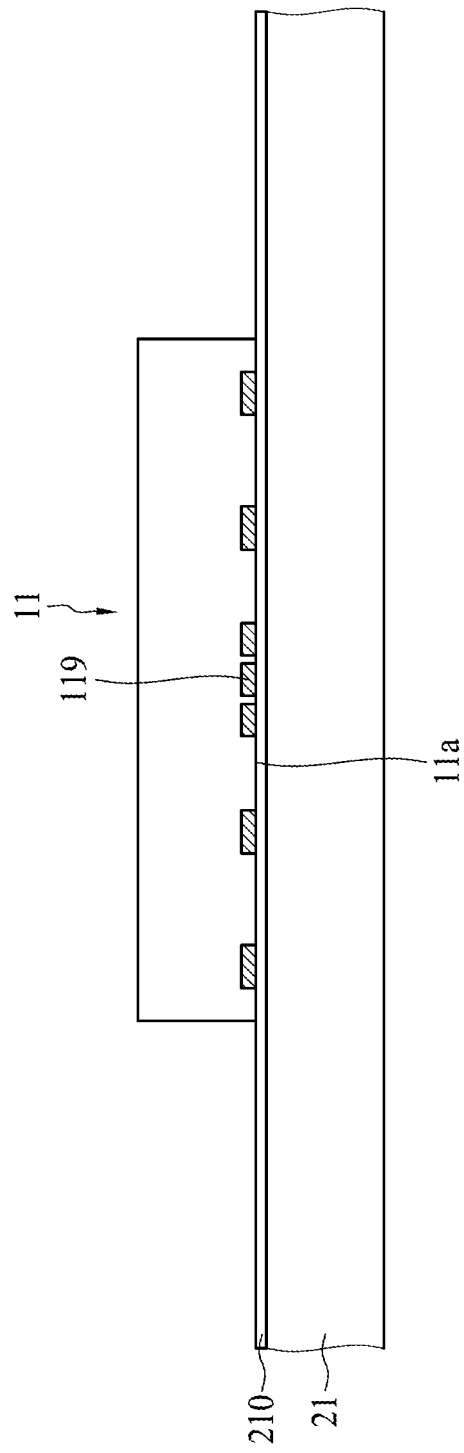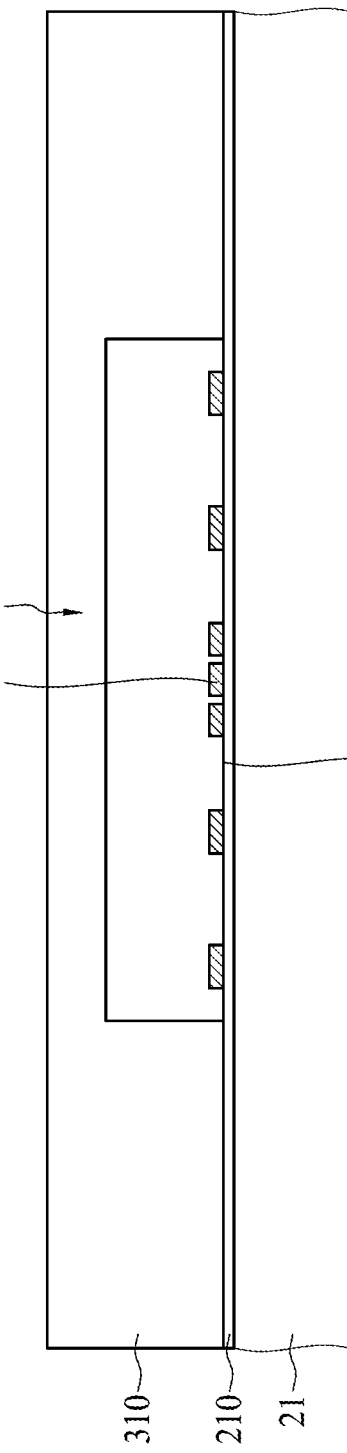

SEMICONDUCTOR PACKAGE STRUCTURE AND METHOD OF MANUFACTURING THE SAME

CROSS REFERENCE TO RELATED APPLICATIONS

This application claims priority to U.S. provisional application Ser. No. 62/878,593, filed 25 Jul. 2019, which is incorporated herein by reference in its entirety.

BACKGROUND

1. Field of the Disclosure

The present disclosure is generally related to semiconductor packaging and, in particular, to a semiconductor package structure and a method of manufacturing the semiconductor package structure.

2. Description of the Related Art

As device electrical performance continues to drive more efficient packaging solutions, methods of solving the speed/performance challenges will be required. For example, semiconductor chips are integrated with an increasing number of electronic components to achieve improved electrical performance and additional functions. As a result, for electrical connection and signal transmission among these chips and components, more intermediate substrates, redistribution structures, input/output (I/O) pads and solder balls are required. All of these various signal "interfaces" may create electrical losses. It may therefore be desirable to have a package structure that can reduce these losses.

SUMMARY

Embodiments of the present disclosure provide a semiconductor package structure. The semiconductor package structure includes a first semiconductor device having an active surface, a redistribution structure in electrical connection with the first semiconductor device, a second semiconductor device bonded to the active surface of the first semiconductor device and disposed between the first semiconductor device and the redistribution structure, and a plurality of conductive elements over the active surface of first semiconductor device and outside the second semiconductor device. The first semiconductor device is electrically connected to the redistribution structure via the conductive elements.

Embodiments of the present disclosure provide a method of manufacturing a semiconductor package structure. The method includes: providing a first semiconductor device having an active surface; forming a plurality of conductive elements over the active surface of first semiconductor device; bonding a second semiconductor device to the active surface of the first semiconductor device, wherein the conductive elements are disposed outside the second semiconductor device; and forming a redistribution structure in electrical connection with the first semiconductor device via the conductive elements, wherein the second semiconductor device is disposed between the first semiconductor device and the redistribution structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 7A through FIG. 7F are cross-sectional views each illustrating one or more stages of a method of manufacturing a semiconductor package structure in accordance with an embodiment of the present disclosure.

FIG. 8A through FIG. 8H are cross-sectional views each illustrating one or more stages of an exemplary method of forming a bonded joint between a first semiconductor device and a second semiconductor device in a semiconductor package structure.

FIG. 10A through FIG. 10E are cross-sectional views each illustrating one or more stages of a method of forming a bonded joint between a first semiconductor device and a second semiconductor device in a semiconductor package structure in accordance with another embodiment of the present disclosure.

FIG. 11A through FIG. 11E are cross-sectional views each illustrating one or more stages of a method of manufacturing a semiconductor package structure in accordance with yet another embodiment of the present disclosure.

FIG. 12A through FIG. 12C are cross-sectional views each illustrating one or more stages of a method of manufacturing a semiconductor package structure in accordance with another embodiment of the present disclosure.

FIG. 14A through FIG. 14J are cross-sectional views each illustrating one or more stages of a method of manufacturing a semiconductor package structure in accordance with an embodiment of the present disclosure.

FIG. 15A through FIG. 15H are cross-sectional views each illustrating one or more stages of a method of manufacturing a semiconductor package structure in accordance with an embodiment of the present disclosure.

DETAILED DESCRIPTION

Figure 1:
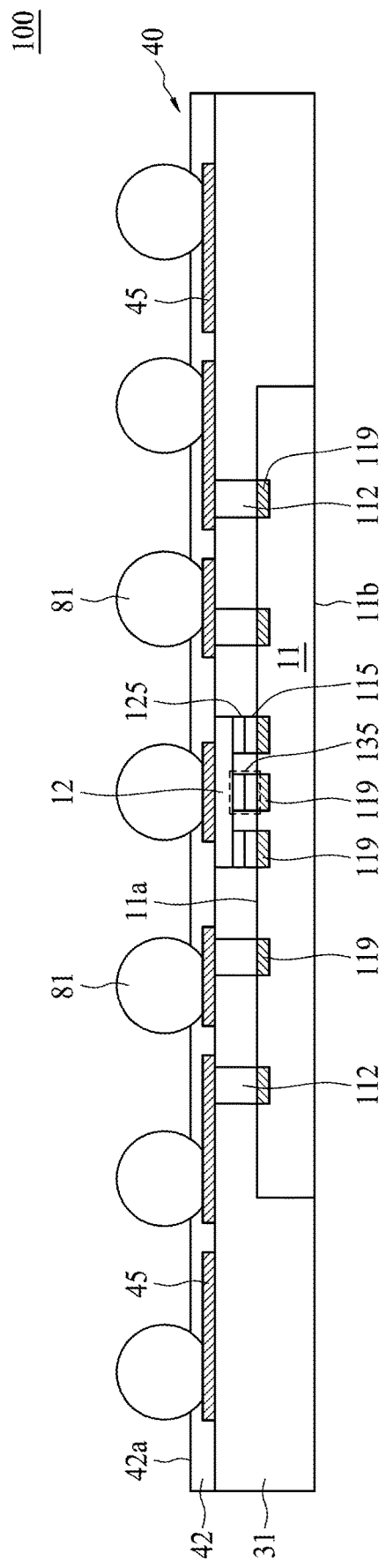
FIG. 1 is a cross-sectional view of a semiconductor package structure in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a semiconductor package structure according to the present disclosure, a second semiconductor device such as a decoupling capacitor, inductor or the like is directly bonded to a first semiconductor device such as a digital processor. With the bonding configuration, electrical losses and impedance through a semiconductor package structure are reduced or minimized. By comparison, in some existing approaches, intermediate or interconnection layers that may include solders and redistribution structures exist between a digital processor and a decoupling capacitor. Relatively high losses and impedance associated with a transmission path going through these layers may thus occur. In some embodiments according to the present disclosure, by placing discrete components such as the decoupling capacitor and interconnection structures closer to a digital processor, the transmission path is shortened while the resistivity of materials is reduced or minimized, thereby enhancing the performance. As a result, with the bonding configuration and closely arranged components to be decoupled, powering and grounding the first semiconductor device and the second semiconductor device may be accomplished in a relatively short path, resulting in less electrical loss.

FIG. 1 is a cross-sectional view of a semiconductor package structure 100 in accordance with an embodiment of the present disclosure.

Referring to FIG. 1, the semiconductor package structure 100 includes a first semiconductor device 11 and a second semiconductor device 12, which are sealed in an encapsulating layer 31. The first semiconductor device 11 has a first surface 11a (the "active surface") and a second surface 11b (the "backside surface") opposite to the first surface 11a, and includes a plurality of conductive pads 119 at the first surface 11a, a plurality of conductive pillars 112 (the "conductive elements") and a plurality of studs 115. The conductive pillars 112 (the "conductive elements") and the studs 115 for electrical connection are disposed on the conductive pads 119. The conductive pillars 112 (the "conductive elements") are disposed over the first surface 11a (the "active surface") of first semiconductor device 11 and outside the second semiconductor device 12. Thus, the first semiconductor device 11 is electrically connected to the redistribution structure 40 via the conductive pillars 112 (the "conductive elements"). The second semiconductor device 12 includes conductive studs 125 bonded onto the conductive studs 115 of the first semiconductor device 11, forming bonded joints 135 between the first semiconductor device 11 and the second semiconductor device 12. The semiconductor package structure 100 also includes a redistribution structure 40, which further includes a dielectric layer 42 and a conductive layer 45. In addition, electrical contacts 81 are mounted on a surface 42a of the redistribution structure 40. As shown in FIG. 1, the electrical contacts 81 are disposed on a conductive layer 45 of the redistribution structure 40. The redistribution structure 40 and the electrical contacts 81 function to provide electrical connection of the first semiconductor device 11 to an external structure that may include other semiconductor devices or components. For example, the semiconductor package structure 100 may be attached via the electrical contacts 81 to a substrate, an interposer or a printed circuit board (PCB).

In an embodiment, the first semiconductor device 11 includes a digital processing device, while the second semiconductor device 12 includes a decoupling capacitor. Moreover, the digital processing device may include one or more general-purpose processing devices such as an application processor, a microprocessor, a central processing unit or a controller. Alternatively, the digital processing device may include one or more special-purpose processing devices such as a digital signal processor (DSP), a graphics processing unit, an application specific integrated circuit (ASIC) or a field programmable gate array (FGA). Furthermore, the digital processing device may include a network processor that further includes a core unit and multiple microengines. Additionally, the digital processing device may include any combination of general-purpose processing devices and special-purpose processing devices.

Furthermore, the decoupling capacitor functions to alleviate noise. A decoupling capacitor is a capacitor used to decouple one part of an electrical network or circuit from another. Noise caused by other circuit elements is shunted through the capacitor, reducing the effect it has on the rest of the circuit. In an embodiment according to the present disclosure, the Q value of the decoupling capacitor is tied to the materials used and the thickness (volume) thereof. When the thickness is reduced along with the downsizing trend, attention is paid to reduce the impedance by, for example, reducing the path between the digital processor (the first semiconductor device 11) and the decoupling capacitor (the second semiconductor device 12) and the portion of the circuit to be decoupled by the decoupling capacitor.

The electrical contacts 81 may include solder balls, which may be arranged in a ball grid array (BGA). Alternatively, the electrical contacts 81 may include metal pads arranged in a land grid array (LGA). Additionally, the electrical contacts 81 may include leads arranged in a pin grid array (PGA). Moreover, the electrical contacts 81 may include controlled collapse chip connection (C4) bumps, which include lead based or lead-free bumps or balls.

When the semiconductor package structure 100 is attached to an external structure such as a PCB, the first semiconductor device 11 is oriented "face-down" with its active surface 11a facing towards the PCB. In such configuration, a significant portion of the encapsulating layer 31 that surrounds the second semiconductor device 12 is disposed between the first semiconductor device 11 and the PCB, which provides desirable mechanical reliability. Moreover, by bonding the first semiconductor device 11 and the second semiconductor device 12, the transmission path is shortened while the resistivity of materials due to intermediate layers that would otherwise exist in some existing approaches is reduced or minimized. In addition, direct connection between the first semiconductor device 11 and the second semiconductor device 12 through the bonded joints 135 helps alleviate parasitic effects and thus reduces electrical losses, as will be discussed below by reference to FIGS. 2A and 2B.

Figure 1A:
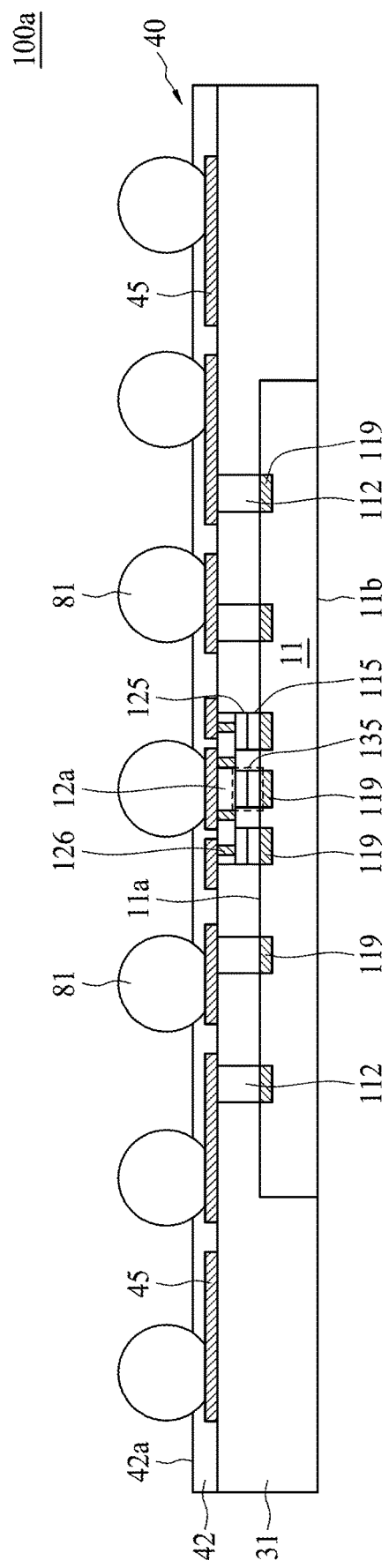
FIG. 1A is a cross-sectional view of a semiconductor package structure in accordance with an embodiment of the present disclosure.

FIG. 1A is a cross-sectional view of a semiconductor package structure 100a in accordance with an embodiment of the present disclosure.

Referring to FIG. 1A, the semiconductor package structure 100a is similar to the semiconductor package structure 100 described and illustrated with reference to FIG. 1 except that, for example, the second semiconductor device 12a further includes a plurality of conductive vias 126. The conductive vias 126 are disposed in the second semiconductor device 12a, and electrically connect the conductive studs 125 and the conductive layer 45. In some embodiments, the conductive vias 126 may be TSVs (through silicon vias).

Figure 2A:
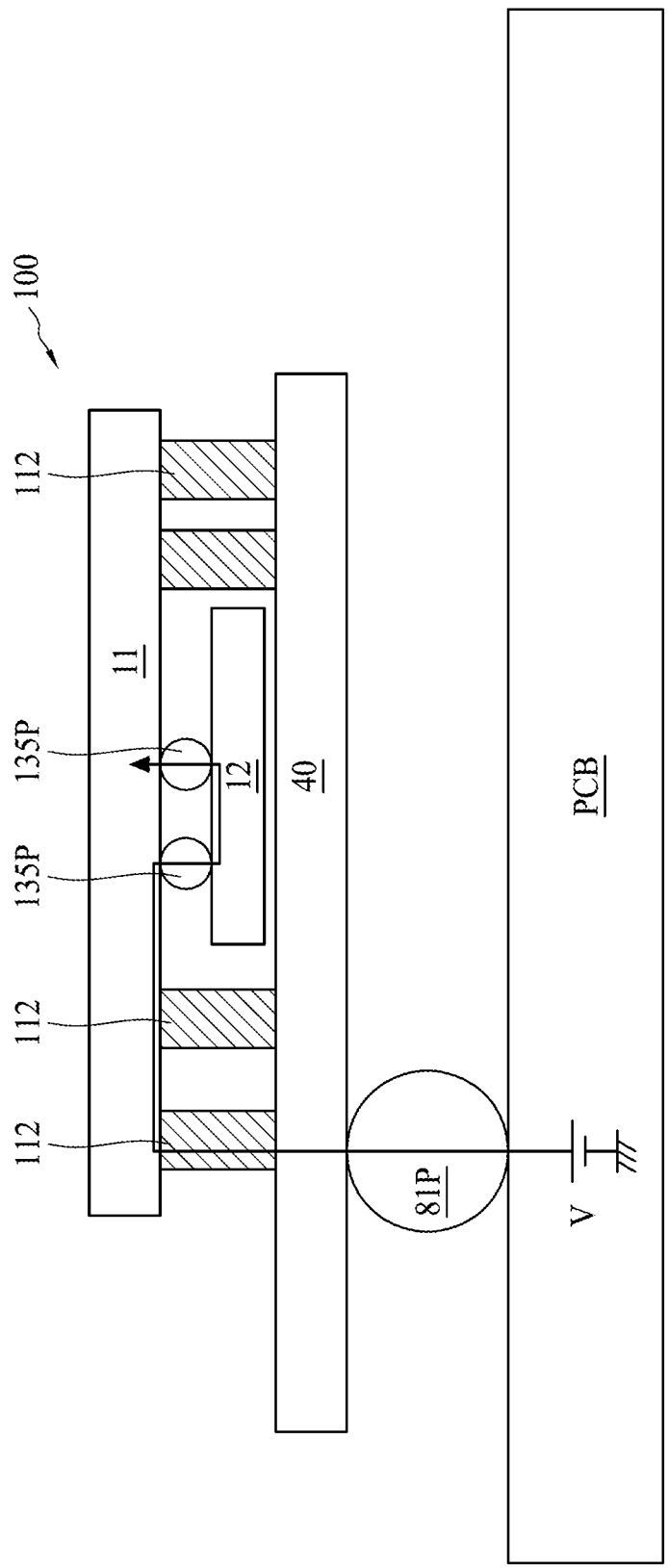
FIG. 2A is a schematic diagram showing a relatively short path for powering a first and a second semiconductor devices in the semiconductor package structure illustrated in FIG. 1.

FIG. 2A is a schematic diagram showing a relatively short path for powering the first semiconductor device 11 and the second semiconductor device 12 in the semiconductor package structure 100 illustrated in FIG. 1.

Referring to FIG. 2A, when the semiconductor package structure 100 is attached to an external structure such as a PCB, a voltage V from the PCB that serves as an operation voltage is provided to the first semiconductor device 11 via one (labeled "81P") of the electrical contacts 81, a wiring route (not shown) in the RDL structure 40, a first conductive pillar 112, a first bonded joint "135P" between the first semiconductor device 11 and the second semiconductor device 12, and then a second bonded joint 135P, forming a powering path (shown in solid lines). The first bonded joint 135P is formed by a conductive stud 125 and a corresponding conductive stud 115, and thus is common to the first semiconductor device 11 and the second semiconductor device 12. The powering path is relatively short for powering the first semiconductor device 11 and the second semiconductor device 12 in the semiconductor package structure 100 on PCB.

Figure 2B:
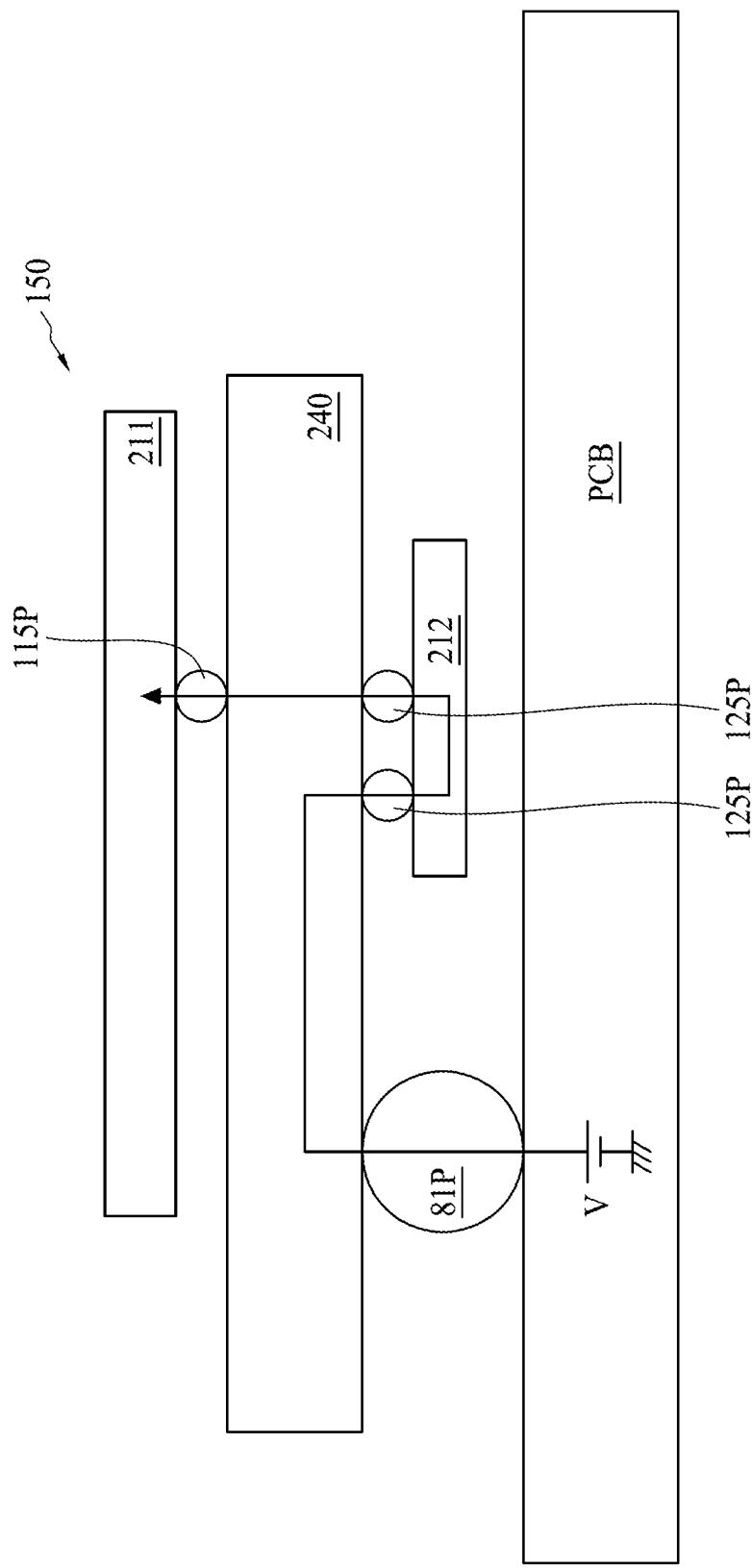
FIG. 2B is a schematic diagram showing by comparison a relatively long path for powering a first and a second semiconductor devices in a different semiconductor package structure.

FIG. 2B is a schematic diagram showing by comparison a relatively long path for powering a first and a second semiconductor devices in a different semiconductor package structure 150. In the semiconductor package structure 100 according to the present disclosure, a first semiconductor device 11 and a second semiconductor device 12 are disposed on a same side of a redistribution structure 40. In particular, the second semiconductor device 12 is disposed between the first semiconductor device 11 and the redistribution structure 40. Referring to FIG. 2B, the semiconductor package structure 150 includes semiconductor devices and components similar to those of the semiconductor package structure 100. However, in the semiconductor package structure 150, a first semiconductor device 211 and a second semiconductor device 212 are disposed on different sides of a redistribution structure 240. In particular, the redistribution structure 240 is disposed between the first semiconductor device 211 and the second semiconductor device 212.

As to the powering path, a voltage V is provided from the PCB via a first electrical contacts 81P, a first wiring route (not shown) on the RDL structure 240, a first conductor 125P, the second semiconductor device 212, and then a second conductor 125P, a second wiring route (not shown) in the RDL structure 240, and a first conductive stud 115P towards the first semiconductor device 211, forming a powering path. The powering path, as compared to that described and illustrated in FIG. 2A, is relatively long for powering the first semiconductor device 211 in the semiconductor package structure 150 on PCB.

The semiconductor package structure 150 described and illustrated with reference to FIG. 2B may employ one of advanced solutions: using a wafer redistribution (RDL) line fabrication process to create an application processor substrate, which may have lower losses due to smaller via sizes, lower dielectric materials and thinner layers. The challenge is that a bottom decoupling capacitor may still have solder balls and I/Os still have to travel through RDL layers to get to the application processor die disposed atop the bottom decoupling capacitor. Lots of losses occur in this path, reducing performance. In addition, the connections between bottom/top additional packages may be limited due to pitch.

From the perspective of a circuit, a decoupling capacitor is placed in front of a power input node of a load such as a processor, and functions to bypass noise and reduce instances of current spikes or starvation in an associated power supply rail. Placing a decoupling capacitor farther away from an associated power or ground pin may result in unwanted inductance and resistance, and hence electrical losses. In contrast, placing a decoupling capacitor closer to an associated power or ground pin may bypass more inductance, and hence result in less electrical loss. In the semiconductor package structure 100 according to the present disclosure, the second semiconductor device 12 (playing the role of a decoupling capacitor) is directly bonded to the first semiconductor device 11 (the processor) without routing for electrical connection to each other through additional intermediate semiconductor structures or components that would otherwise be required in some existing approaches, including the semiconductor package structure 150. A person having ordinary skill in the art can readily understand that the relatively long path in the semiconductor package structure 150 illustrated in FIG. 2B may incur more parasitic effects than the relatively short path in the semiconductor package structure 100 illustrated in FIG. 2A. As a result, the electrical losses can be significantly reduced in the semiconductor package structure 100.

Figure 3A:
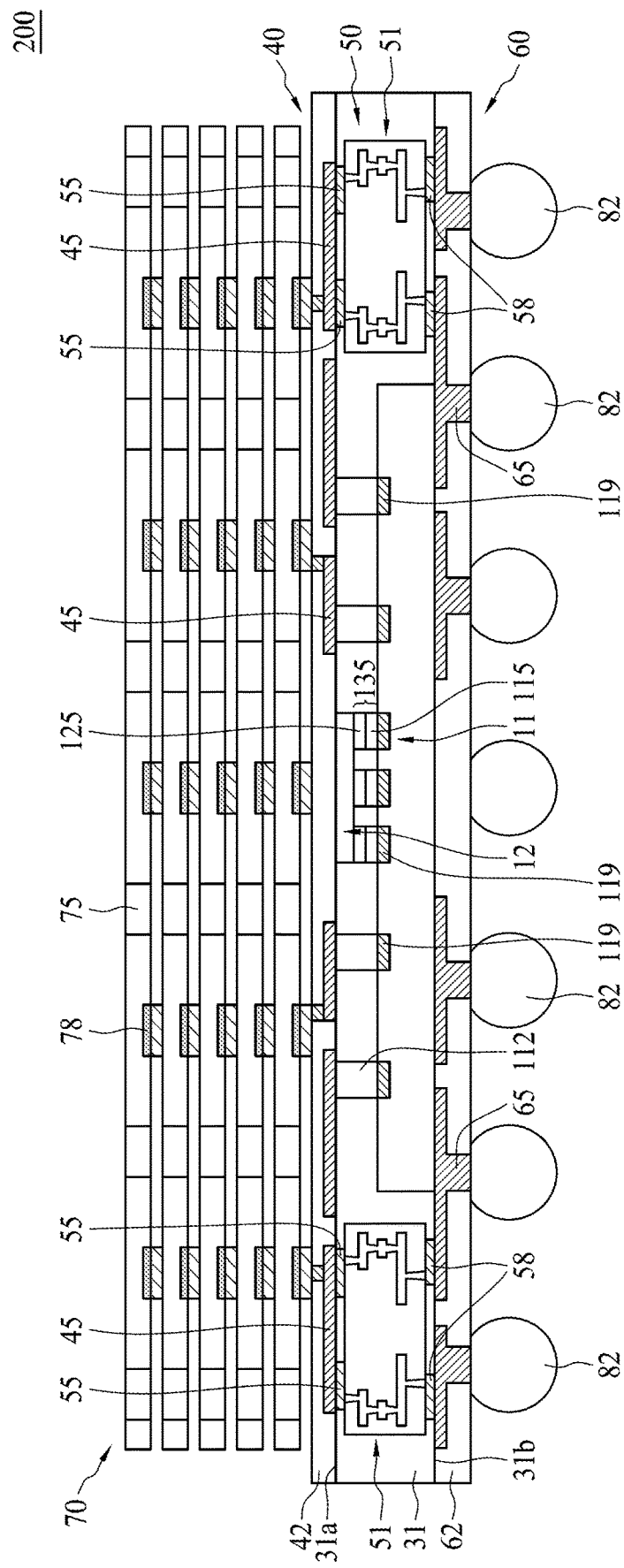
FIG. 3A is a cross-sectional view of a semiconductor package structure in accordance with another embodiment of the present disclosure.

FIG. 3A is a cross-sectional view of a semiconductor package structure 200 in accordance with another embodiment of the present disclosure.

Referring to FIG. 3A, the semiconductor package structure 200 includes a first semiconductor device 11, a second semiconductor device 12 and a substrate 50 (the "interposer"), which are all sealed in an encapsulating layer 31. The encapsulating layer 31 has a first surface 31a and a second surface 31b opposite to the first surface 31a. The substrate 50 substantially surrounds the first semiconductor device 11 and the second semiconductor device 12, and supports signal transmission in the semiconductor package structure 200. In an embodiment, the substrate 50 includes a coreless substrate 51. Alternatively, the substrate 50 may include a wafer-based redistribution structure instead of a coreless substrate to suit different design rules, and a direct redistribution layer (RDL) plating technology for copper vias may be used. In the case of a coreless substrate as in the present embodiment, the coreless substrate 51 includes wiring layers and micro vias in electrical connection with the wiring layers. Furthermore, first conductive pads 55 (the upper pads) and second conductive pads 58 (the lower pads) of the coreless substrate 51 serve as input/output (I/O) pads for electrical connection of the wiring layers to other semiconductor devices, components or structures. As shown in FIG. 3A, the first conductive pads 55 are disposed adjacent to the first surface 31a of the encapsulating layer 31, and in electrical connection with the first redistribution structure 40. Communication throughout the wiring layers is accomplished by micro vias instead of plated through holes. The coreless substrate 51 may be used as direct pass through for signal transmission in a substantially vertical direction. Moreover, the coreless substrate 51 may facilitate additional routing for signal transmission via different wiring layers in a substantially transverse direction. Furthermore, passive devices may be embedded in the wiring layers of the coreless substrate 51 so that the coreless substrate 51 can be used with desirable area efficiency.

Figure 4B:
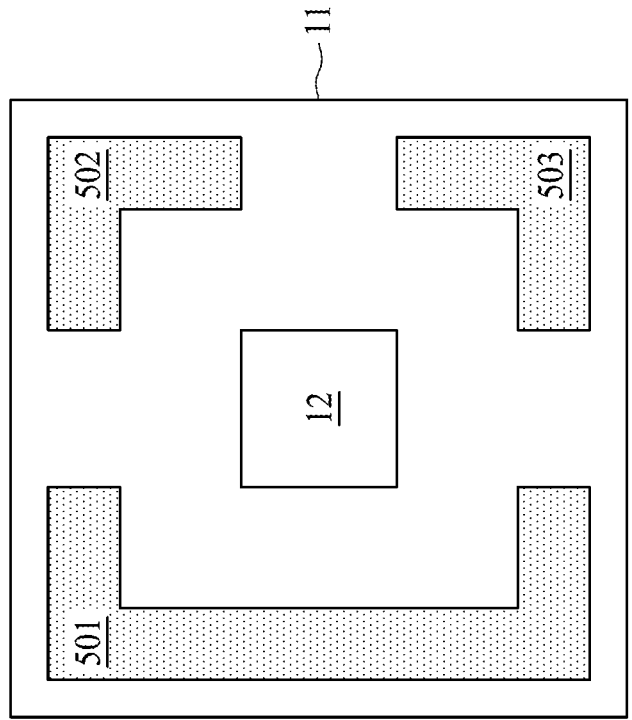
FIGS. 4A and 4B are schematic top views of a substrate in the semiconductor package structure illustrated in FIG. 3A, in accordance with embodiments of the present disclosure.
Figure 4A:
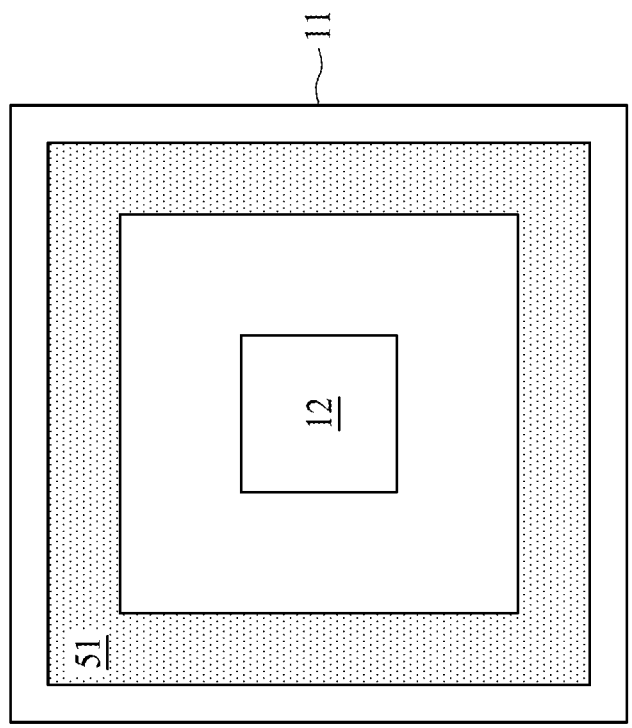

In some embodiments, the coreless substrate 51 takes the form of a continuous ring or a continuous rectangle. FIG. 4A is a schematic top view of an exemplary coreless substrate 51 having a continuous, rectangular shape. The continuous rectangle may be formed by preparing a complete, rectangle coreless substrate in a separate manufacturing process, and then removing a center portion thereof for accommodation of a first semiconductor device 11 by using, for example, a laser cutting process.

In other embodiments, the coreless substrate 51 includes separate sections that collectively form a ring or rectangular contour. FIG. 4B is a schematic top view of an exemplary coreless substrate 51 including discrete sections 501, 502, 503. These sections 501, 502, 503 may be formed in a separate manufacturing process, and then are individually attached onto the carrier 21 (FIG. 7).

Referring back to FIG. 3A, the semiconductor package structure 200 also includes a first redistribution structure 40 (the "redistribution structure") disposed on the first surface 31a of the encapsulating layer 31, and a second redistribution structure 60 (the "first additional redistribution structure") disposed on the second surface 31b of the encapsulating layer 31. The first redistribution structure 40 may include several dielectric layers and conductive layers. For convenience, only a dielectric layer 42 and a conductive layer 45 are shown. Likewise, the second redistribution structure 60 includes a dielectric layer 62 and a conductive layer 65, even though it may include several dielectric layers and conductive layers. As shown in FIG. 3A, the second conductive pads 58 are disposed adjacent to the second surface 31b of the encapsulating layer 31, and in electrical connection with the second redistribution structure 60 (the "first additional redistribution structure").

The semiconductor package structure 200 further includes one or more third semiconductor devices 70, which are attached to the first redistribution structure 40. Each of the third semiconductor devices 70 includes conductive vias 75 and I/O pads 78 for signal transmission. In the present embodiment, the third semiconductor devices 70 are arranged in a stack. In an embodiment, the third semiconductor device 70 includes a memory, for example, a wide I/O memory such as a high bandwidth memory (HBM). A wide I/O memory may include more than six hundred (600) I/O counts, for example, 2,000 to 5,000 I/O counts. Communication between the first semiconductor device 11 and the third semiconductor device 70 is accomplished by an electrical path routing from the first semiconductor device 11 via a conductive pillar 112, a conductive layer 45 in the first redistribution structure 40, and an I/O pad 78 towards the third semiconductor device 70, and vice versa.

The semiconductor package structure 200 also includes electrical contacts 82 mounted on the second redistribution structure 60 for electrical connection to, for example, an external device, component or structure such as a substrate, an interposer, a PCB or the like. Communication between the first semiconductor device 11 and the external device is accomplished by an electrical path routing from the first semiconductor device 11 via a conductive pillar 112, a conductive layer 45 in the first redistribution structure 40, an upper pad 55 of the coreless substrate 51 in electrical connection with the conductive layer 45, wiring layers in the coreless substrate 51, a conductive layer 65 in the second redistribution structure 60, an electrical contact 82, and an electrical connection with the conductive layer 65 towards the PCB, and vice versa.

In the semiconductor package structure 200, the second semiconductor device 12 is directly bonded to the first semiconductor device 11. Like the semiconductor package structure 100 described and illustrated with reference to FIG. 1, by bonding the first semiconductor device 11 and the second semiconductor device 12, the transmission path is shortened while the resistivity of materials due to intermediate layers that would otherwise exist in some existing approaches is minimized. Moreover, by placing components, which may include the first redistribution structure 40 and the third semiconductor devices 70, to be served (to be decoupled) by the second semiconductor device 12 (a decoupling capacitor) closer to the first semiconductor device 11, likewise the transmission path is shortened and the impedance is reduced. In addition, powering the first semiconductor device 11 and the second semiconductor device 12 is accomplished in a relatively short path. As a result, the semiconductor package structure 200 also benefits from the bonding configuration and may ensure less electrical loss.

Furthermore, in the semiconductor package structure 200, the first semiconductor device 11 is placed "face-up" with the first surface 11a (the active surface) facing towards the third semiconductor device 70. Such configuration, with the help of the conductive pillars 112, facilitates routing between the first semiconductor device 11 and the third semiconductor device 70 disposed above the first semiconductor device 11. The face-up first semiconductor device 11 directly communicates with the second semiconductor device 12 though the bonded joints 135, and communicates with the third semiconductor device 70 through the first redistribution structure 40.

Figure 3B:
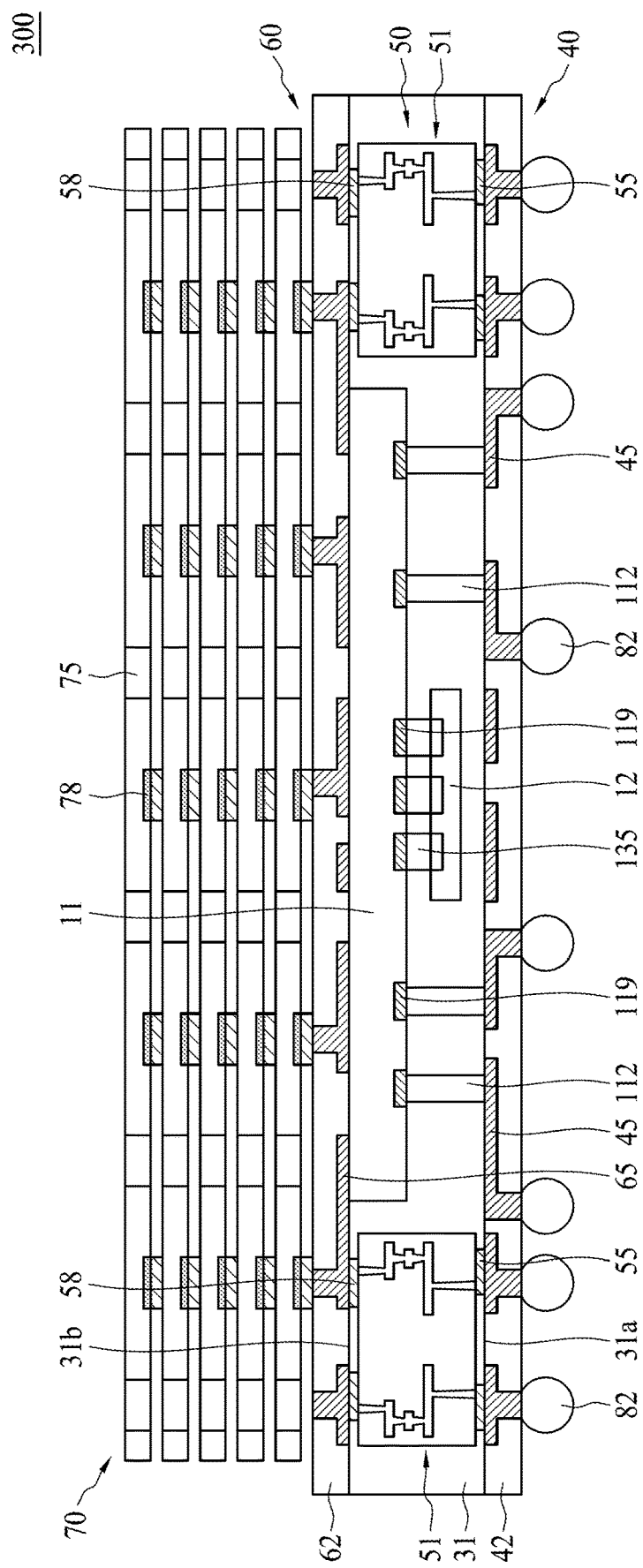
FIG. 3B is a cross-sectional view of a semiconductor package structure in accordance with yet another embodiment of the present disclosure.

FIG. 3B is a cross-sectional view of a semiconductor package structure 300 in accordance with yet another embodiment of the present disclosure.

Referring to FIG. 3B, the semiconductor package structure 300 is similar to the semiconductor package structure 200 described and illustrated with reference to FIG. 3A except that, for example, the first semiconductor device 11 is placed "face-down" with the first surface 11a (the active surface) facing towards the electrical contacts 82. When the semiconductor package structure 300 is attached to an external structure such as a PCB via the electrical contacts 82, a significant portion of the encapsulating layer 31 that surrounds the second semiconductor device 12 is disposed between the first semiconductor device 11 and the PCB, which provides desirable mechanical reliability. In addition, direct connection between the first semiconductor device 11 and the second semiconductor device 12 through the bonded joints 135 helps alleviate parasitic effects and thus reduces electrical losses.

Figure 3C:
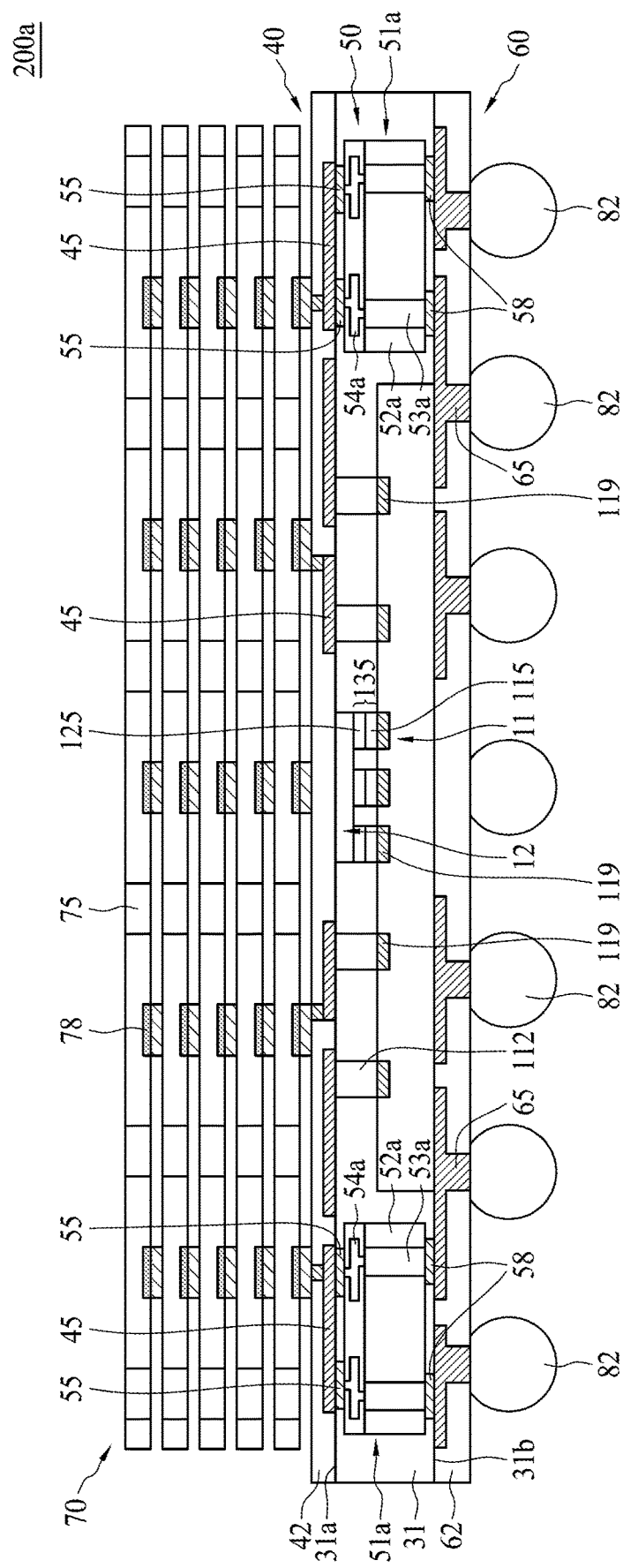
FIG. 3C is a cross-sectional view of a semiconductor package structure in accordance with yet another embodiment of the present disclosure.

FIG. 3C is a cross-sectional view of a semiconductor package structure 200a in accordance with yet another embodiment of the present disclosure.

Referring to FIG. 3C, the semiconductor package structure 200a is similar to the semiconductor package structure 200 described and illustrated with reference to FIG. 3A except that, for example, the coreless substrate 51 is replaced by a pre-molded carrier 51a. The pre-molded carrier 51a includes a main body 52a, a plurality of through vias 53a and at least one routing layer 54a. A material of the main body 52a may be a molding compound. The through vias 53a extend through the main body 52a. A bottom portion of the through via 53a may be electrically connected to the second conductive pad 58. The routing layer 54a may be disposed on the main body 52a, and may electrically connect the through vias 53a and the first conductive pads 55. Since materials of the encapsulating layer 31 and the main body 52a of the pre-molded carrier 51a may be both molding compounds, their coefficients of thermal expansion (CTEs) may be the same or be very close, thus, when the pre-molded carrier 51a is sealed in the encapsulating layer 31, a warpage of the encapsulating layer 31 is reduced. In addition, the Dk/Df electrical properties are improved.

Figure 3D:
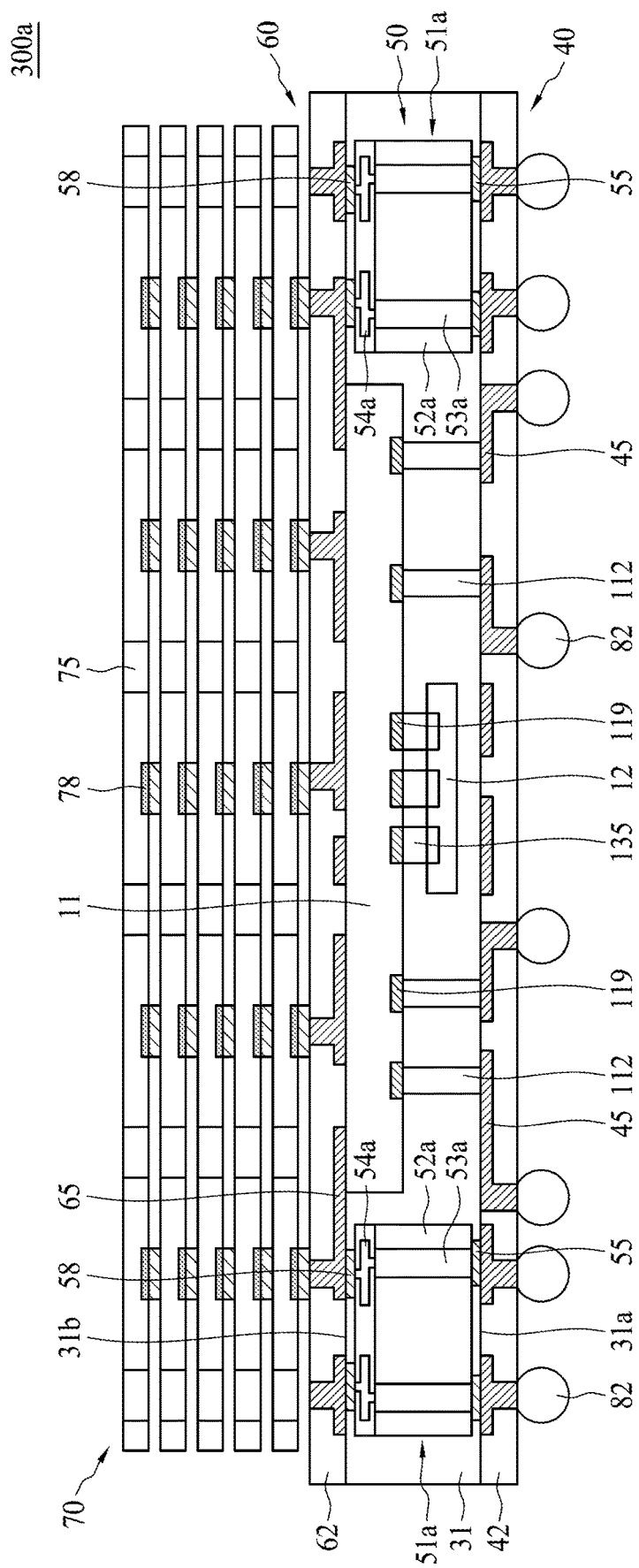
FIG. 3D is a cross-sectional view of a semiconductor package structure in accordance with yet another embodiment of the present disclosure.

FIG. 3D is a cross-sectional view of a semiconductor package structure 300a in accordance with yet another embodiment of the present disclosure.

Referring to FIG. 3D, the semiconductor package structure 300a is similar to the semiconductor package structure 300 described and illustrated with reference to FIG. 3B except that, for example, the coreless substrate 51 is replaced by a pre-molded carrier 51a. The pre-molded carrier 51a includes a main body 52a, a plurality of through vias 53a and at least one routing layer 54a. A material of the main body 52a may be a molding compound. The through vias 53a extend through the main body 52a. A bottom portion of the through via 53a may be electrically connected to the second conductive pad 58. The routing layer 54a may be disposed on the main body 52a, and may electrically connect the through vias 53a and the first conductive pads 55. Since materials of the encapsulating layer 31 and the main body 52a of the pre-molded carrier 51a may be both molding compounds, their coefficients of thermal expansion (CTEs) may be the same or be very close, thus, when the pre-molded carrier 51a is sealed in the encapsulating layer 31, a warpage of the encapsulating layer 31 is reduced. In addition, the Dk/Df electrical properties are improved.

Figure 5A:
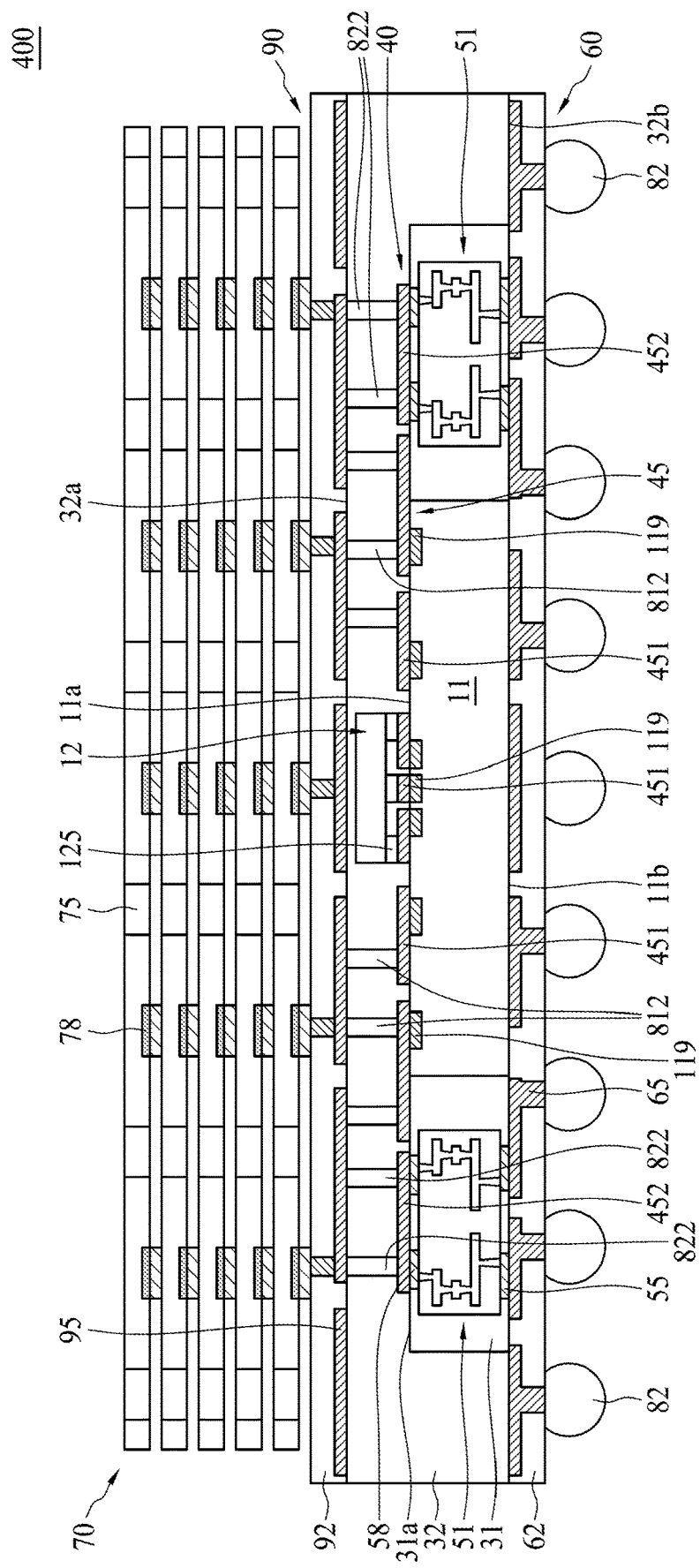
FIG. 5A is a cross-sectional view of a semiconductor package structure in accordance with an embodiment of the present disclosure.

FIG. 5A is a cross-sectional view of a semiconductor package structure 400 in accordance with an embodiment of the present disclosure.

Referring to FIG. 5A, the semiconductor package structure 400 includes a first semiconductor device 11, a second semiconductor device 12 bonded to the first semiconductor device 11, a coreless substrate 51, a first redistribution structure 40 (the "second additional redistribution structure"), a second redistribution structure 60 (the "first additional redistribution structure") and a third redistribution structure 90 (the "redistribution structure"). The first semiconductor device 11 and the coreless substrate 51 are sealed in a first encapsulating layer 31 (the "additional encapsulating layer"). Moreover, the first semiconductor device 11, the first encapsulating layer 31 (the "additional encapsulating layer"), the second semiconductor device 12 and the conductive pillars (including the first conductive pillars 812 and the second conductive pillars 822) are sealed in a second encapsulating layer 32 (the "encapsulating layer"). The first semiconductor device 11 includes conductive pads 119 at a first surface 11a. The first redistribution structure 40 includes a conductive layer 45, which further includes a first portion 451 disposed on the conductive pads 119 of the first semiconductor device 11, and a second portion 452 disposed on second conductive pads 58 of the coreless substrate 51. The first conductive pads 55 and the second conductive pads 58 are substantially flush with the first surface 11a and the second surface 11b of the first semiconductor device 11, respectively.

In the present embodiment, the first semiconductor device 11 may include densely spaced I/O's with a relatively tight spacing. For example, the conductive pads 119 of the first semiconductor device 11 are arranged at a finer pitch than the conductive studs 125 of the second semiconductor device 12, or are arranged at a finer pitch than the conductive layer 95 in the third redistribution structure 90. The first portion 451 of the conductive layer 45 is disposed on the conductive pads 119 of the first semiconductor device 11 to facilitate fan-out of the I/O's on the conductive pads 119. Furthermore, first conductive pillars 812 are disposed on the first portion 451 to help the fan-out. In addition, the semiconductor package structure 400 includes second conductive pillars 822 disposed on the second portion 452 to provide electrical connection between the first redistribution structure 40 and the third redistribution structure 90. The second conductive pillars 822 may help signal fan-out, which is desirable for a first semiconductor device 11 that has a relatively tight spacing.

The semiconductor package structure 400 further includes one or more third semiconductor devices 70, which are attached to the third redistribution structure 90. Communication between the first semiconductor device 11 and the third semiconductor devices 70 is accomplished by an electrical path routing from the first semiconductor device 11 via the first portion 451 of the conductive layer 45 in the first redistribution structure 40, a first conductive pillar 812 on the first portion 451, a conductive layer 95 in the third redistribution structure 90, and an I/O pad 78 towards the third semiconductor device 70, and vice versa.

The second redistribution structure 60, disposed on the second surface 11b of the first semiconductor device 11, includes a dielectric layer 62 and a conductive layer 65. Electrical contacts 82 such as solder balls are disposed on the second redistribution structure 60 for electrical connection of the first semiconductor device 11 to an external device such as a PCB. Communication between the first semiconductor device 11 and the PCB is accomplished by an electrical path routing from the first semiconductor device 11 via the first portion 451 of the conductive layer 45 in the first redistribution structure 40, a first conductive pillar 812 on the first portion 451, the conductive layer 95 in the third redistribution structure 90, a second conductive pillar 822 on the coreless substrate 51, a second portion 452 of the conductive layer 45 on the coreless substrate 51, wiring layers in the coreless substrate 51, a first pad 55 of the coreless substrate 51, a conductive layer 65 in the second redistribution structure 60, and an electrical contact 82 towards the PCB, and vice versa.

In the semiconductor package structure 400, the second semiconductor device 12 is directly bonded to the first semiconductor device 11. Like the semiconductor package structure 100 described and illustrated with reference to FIG. 1, by bonding the first semiconductor device 11 and the second semiconductor device 12, the transmission path is shortened while the resistivity of materials due to intermediate layers that would otherwise exist in some existing approaches is minimized. Moreover, by placing components, which may include the first redistribution structure 40, the third semiconductor devices 70 and the third redistribution structure 90, to be served (to be decoupled) by the second semiconductor device 12 (a decoupling capacitor) closer to the first semiconductor device 11, likewise the transmission path is shortened and the impedance is reduced. In addition, powering the first semiconductor device 11 and the second semiconductor device 12 is accomplished in a relatively short path. As a result, the semiconductor package structure 400 also benefits from the direct bonding configuration and may ensure less electrical loss.

Furthermore, in the semiconductor package structure 400, the first semiconductor device 11 is placed "face-up" with the first surface 11a (the active surface) facing towards the third semiconductor device 70. Such configuration, with the help of the first conductive pillars 812 and the second conductive pillars 822, facilitates routing between the first semiconductor device 11 and the third semiconductor device 70 disposed above the first semiconductor device 11. The face-up first semiconductor device 11 directly communicates with the second semiconductor device 12 through the bonded joints 135, and communicates with the third semiconductor device 70 through the first redistribution structure 40 and the third redistribution structure 90.

Figure 5B:
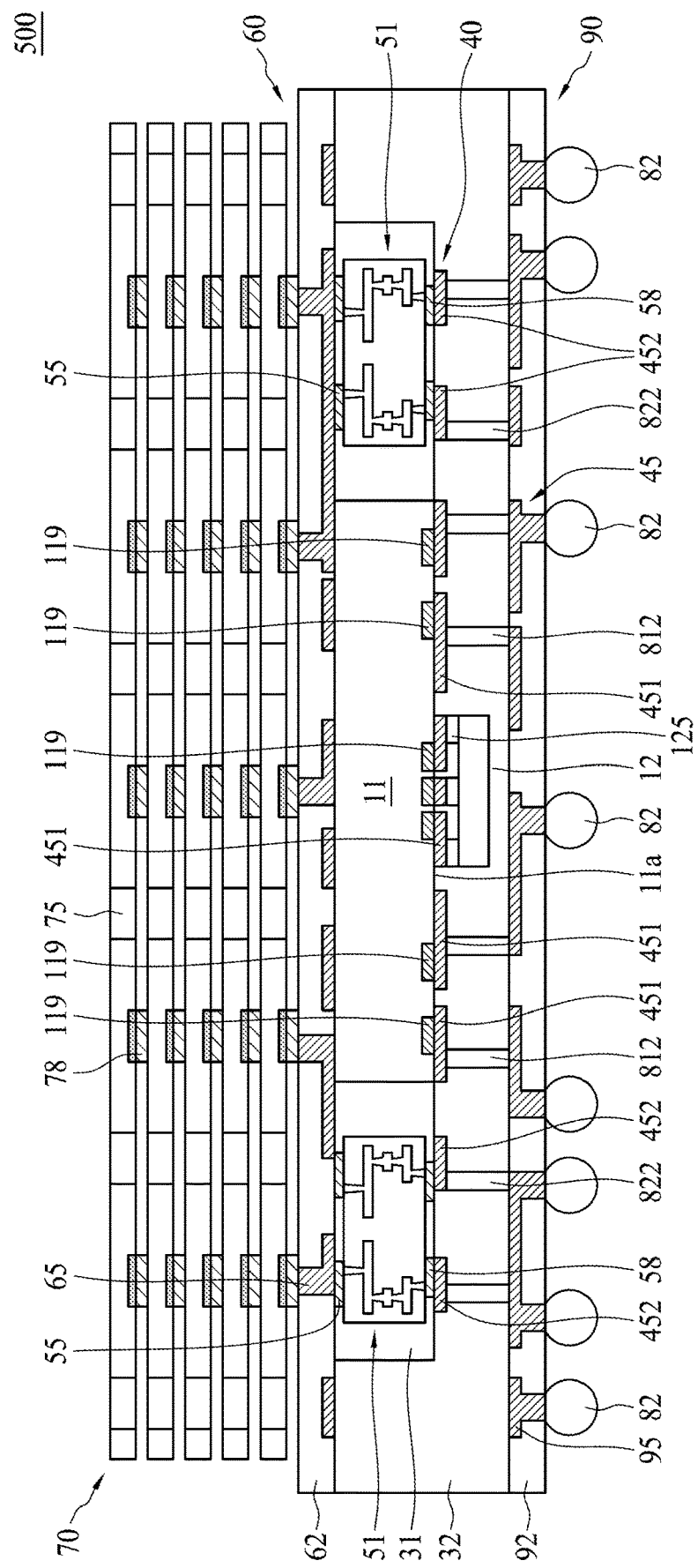
FIG. 5B is a cross-sectional view of a semiconductor package structure in accordance with another embodiment of the present disclosure.

FIG. 5B is a cross-sectional view of a semiconductor package structure 500 in accordance with an embodiment of the present disclosure.

Referring to FIG. 5B, the semiconductor package structure 500 is similar to the semiconductor package structure 400 described and illustrated with reference to FIG. 5A except that, for example, the first semiconductor device 11 is placed "face-down" with the first surface 11a (the active surface) facing towards the electrical contacts 82. When the semiconductor package structure 500 is attached to an external structure such as a PCB via the electrical contacts 82, a significant portion of the second encapsulating layer 32 that surrounds the second semiconductor device 12 is disposed between the first semiconductor device 11 and the PCB, which provides desirable mechanical reliability. In addition, direct connection between the first semiconductor device 11 and the second semiconductor device 12 through the bonded joints 135 helps alleviate parasitic effects and thus reduces electrical losses.

Figure 6:
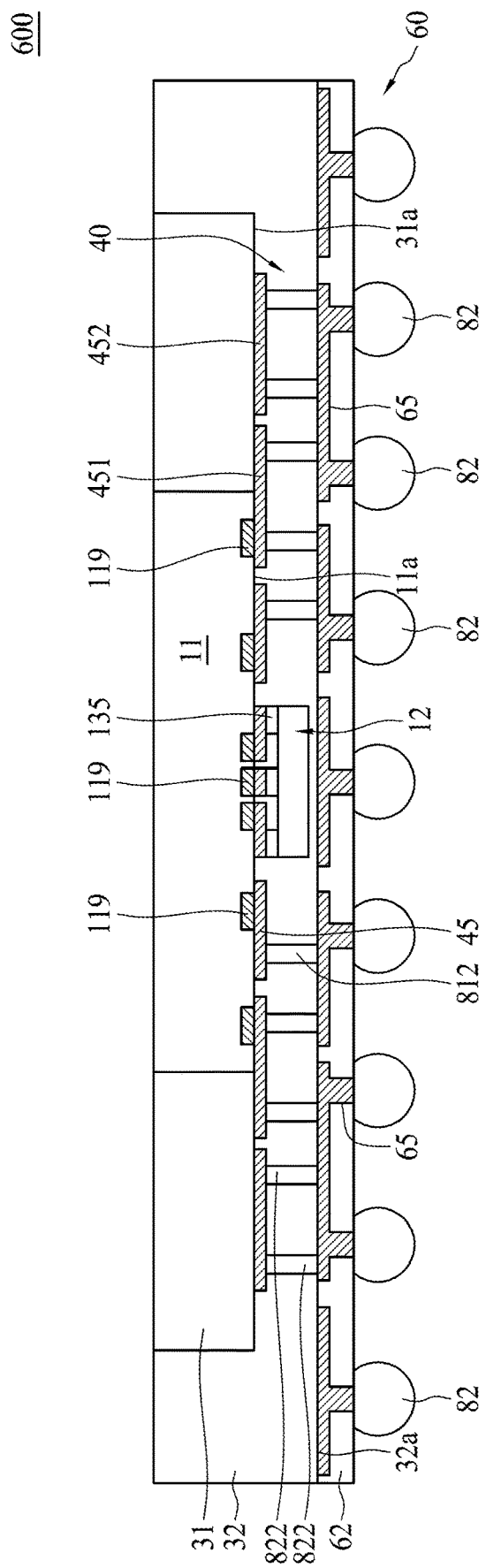
FIG. 6 is a cross-sectional view of a semiconductor package structure in accordance with still another embodiment of the present disclosure.

FIG. 6 is a cross-sectional view of a semiconductor package structure 600 in accordance with still another embodiment of the present disclosure.

Referring to FIG. 6, the semiconductor package structure 600 includes a first semiconductor device 11, a second semiconductor device 12, a first redistribution structure 40 and a second redistribution structure 60. The first semiconductor device 11 is sealed in a first encapsulating layer 31. In addition, the second semiconductor device 12 and the first encapsulating layer 31 are sealed in a second encapsulating layer 32. The first semiconductor device 11 includes conductive pads 119 at a first surface 11a. The first redistribution structure 40, disposed on the first surface 11a of the first semiconductor device 11 and a first surface 31a of the first encapsulating layer 31, includes a conductive layer 45. A first portion 451 of the conductive layer 45 is disposed on the conductive pads 119 at the first surface 11a of the first semiconductor device 11. A second portion 452 of the conductive layer 45 is disposed on the first surface 31a of the first encapsulating layer 31 and is separate from the first portion 451. The second semiconductor device 12 is bonded to the first semiconductor device 11, forming bonded joints 135 therebetween.

Similar to the embodiment described and illustrated with reference to in FIG. 5A, in the present embodiment, the first semiconductor device 11 may include densely spaced I/O's with a relatively tight spacing. Specifically, the conductive pads 119 of the first semiconductor device 11 are arranged at a finer pitch than those of the second semiconductor device 12. The first portion 451 of the conductive layer 45 is disposed on the conductive pads 119 of the first semiconductor device 11 to facilitate fan-out of the I/O's on the conductive pads 119. Moreover, the semiconductor package structure 600 includes first conductive pillars 812 disposed on the first portion 451 and extending between the first redistribution structure 40 and the second redistribution structure 60 to provide electrical connection for the first semiconductor device 11. The semiconductor package structure 600 also includes second conductive pillars 822 disposed on the second portion 452 and extending between the first redistribution structure 40 and the second redistribution structure 60 to help fan-out.

In the semiconductor package structure 600, the second semiconductor device 12 is directly bonded to the first semiconductor device 11. Like the semiconductor package structure 100 described and illustrated with reference to FIG. 1, by bonding the first semiconductor device 11 and the second semiconductor device 12, the transmission path is shortened while the resistivity of materials due to intermediate layers that would otherwise exist in some existing approaches is minimized. Moreover, powering the first semiconductor device 11 and the second semiconductor device 12 is accomplished in a relatively short path. As a result, the semiconductor package structure 600 benefits from the direct bonding configuration and may ensure less electrical loss. Moreover, a significant portion of the second encapsulating layer 32 that surrounds the second semiconductor device 12 is disposed between the first semiconductor device 11 and an external device such as a PCB, which provides desirable mechanical reliability.

FIG. 7A through FIG. 7F are cross-sectional views each illustrating one or more stages of a method of manufacturing the semiconductor package structure 100 as described and illustrated with reference to FIG. 1, in accordance with an embodiment of the present disclosure.

Referring to FIG. 7A, a first semiconductor device 11, which has a first surface 11a and a second surface 11b opposite to the first surface 11a, is formed on a wafer. Conductive pillars 112 and conductive studs 115 for electrical connection to other devices, components or structures are formed on conductive pads 119 at the first surface 11a (the "active surface"). Thus, the conductive pillars 112 are formed over the first surface 11a (the "active surface") of the first semiconductor device 11. As described earlier, the first semiconductor device 11 includes a digital processing device. Suitable materials for the conductive pillars 112 and conductive studs 115 may include copper (Cu), gold (Au), aluminum (Al), palladium (Pd) or solder, or an alloy thereof.

Referring to FIG. 7B, a second semiconductor device 12 is provided. The second semiconductor device 12, prepared in another manufacturing process, includes conductive studs 125 formed on a first surface 121 thereof. The second semiconductor device 12 is placed face-down towards the first surface 11a of the first semiconductor device 11 so that the conductive studs 125 correspond in position to the conductive studs 115. Subsequently, the second semiconductor device 12 is bonded to the first semiconductor device 11 (an arrow showing the movement). As described earlier, the second semiconductor device 12 includes a decoupling capacitor. Suitable materials for the conductive studs 125 may include copper (Cu), gold (Au), aluminum (Al), palladium (Pd) or solder, or an alloy thereof.

In some embodiments, the conductive studs 115 and 125 contact each other directly. For example, the conductive studs 115 and 125 are bonded to each other in a copper-to-copper (Cu-to-Cu) directly bonding process, as will be discussed in detail with reference to FIGS. 8A to 8H. Alternatively, the conductive studs 115 and 125 may be bonded to each other in a solder-joint bonding process, as will be discussed in detail with reference to FIGS. 10A to 10E.

Figure 7C:
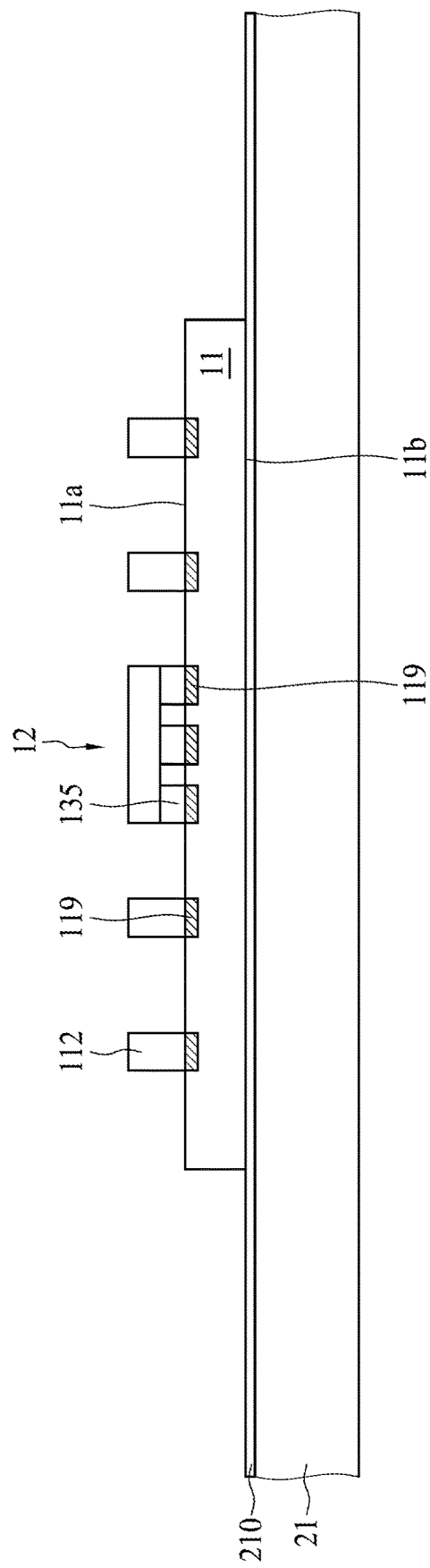

The first semiconductor device 11 bonded with the second semiconductor device 12 is then separated from other semiconductor devices in a wafer dicing process. Referring now to FIG. 7C, a carrier 21 with a release film 210 is provided. The first semiconductor device 11, currently in the form of a semiconductor die or chip after wafer dicing, is attached at the second surface 11b thereof onto the release film 210. The carrier 21 functions to support semiconductor components, devices or structures to be subsequently formed or disposed thereon. In an embodiment, the carrier 21 includes organic materials, for example, Bismaleimide Triazine (BT), polyimide (PI), Ajinomoto build-up film (ABF), or other suitable materials. Alternatively, the carrier 21 includes inorganic materials, for example, silicon, glass, or other suitable materials. The release film 210 functions to facilitate release of the carrier 21 from a semiconductor structure temporarily held by the carrier 21. In an embodiment, the release film 210 includes non-metallic materials, for example, PI, ABF, epoxy, molding compound, solder mask ink, or other suitable materials. Additionally, the release film 210 is optional and thus may be omitted.

Figure 7D:
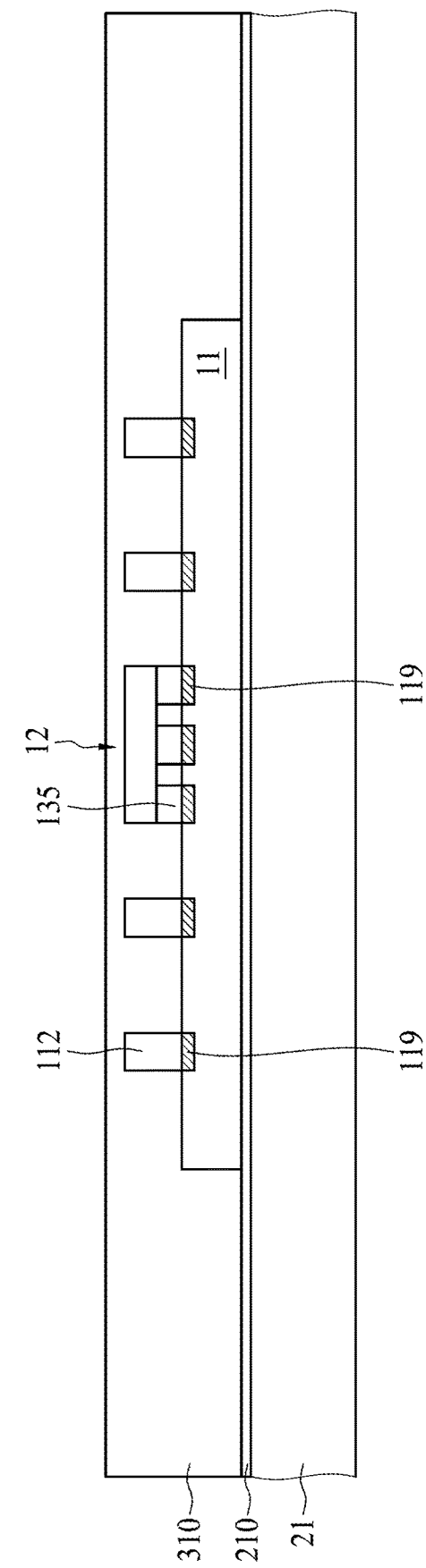

Referring to FIG. 7D, an encapsulating layer 310 is formed on the carrier 21, covering the first semiconductor device 11 and the second semiconductor device 12. The encapsulating layer 310 may include a molding compound.

Referring to FIG. 7E, the encapsulating layer 310 is then reduced in height by, for example, a grinding process such as a mechanical polishing process, resulting in a reduced encapsulating layer 31. The reduced encapsulating layer 31 exposes the conductive pillars 112. The carrier 21 together with the release film 210 is then removed. In some embodiments, the carrier 21 includes a glass carrier, which may be removed in a laser debonding process.

Next, referring to FIG. 7F, a redistribution structure 40 is formed on the reduced encapsulating layer 31. The redistribution structure 40 functions to provide interconnection and may include a dielectric layer 42 and a conductive layer 45. The redistribution structure 40 is in electrical connection with the first semiconductor device 11 via the conductive elements (the conductive pillars 112). In an embodiment, the dielectric layer 42 includes organic materials, for example, a molding compound, polyamide (PA), polyimide (PI), polybenzoxazole (PBO) or an epoxy-based material. In another embodiment, the dielectric layer 42 includes inorganic materials, for example, silicon oxide (SiOx), silicon nitride (SiNx) or tantalum oxide (TaOx). In addition, the conductive layer 45 includes titanium (Ti), a titanium-tungsten alloy (TiW), nickel (Ni), copper (Cu), a titanium-copper alloy (TiCu), silver (Ag), gold (Au) or other suitable conductive materials.

Subsequently, referring back to FIG. 1, electrical contacts 81 are mounted on a surface 42a of the redistribution structure 40 over the reduced encapsulating layer 31. The electrical contacts 81 provide electric connection between the first semiconductor device 11 and an external structure (not shown). In an embodiment, the electrical contacts 81 may include solder balls, which may be arranged in a ball grid array "BGA". In another embodiment, the electrical contacts 81 may include metal pads arranged in a land grid array (LGA). In yet another embodiment, the electrical contacts 81 may include leads arranged in a pin grid array (PGA). Moreover, the electrical contacts 81 may include controlled collapse chip connection (C4) bumps, which include lead based or lead-free bumps or balls.

FIG. 8A through FIG. 8H are cross-sectional views each illustrating one or more stages of an exemplary method of forming a bonded joint 135 between a first semiconductor device 11 and a second semiconductor device 12 in the semiconductor package structure 100 as described and illustrated with reference to FIG. 1. The exemplary method includes forming a conductive stud on an input/output (I/O) pad of the first semiconductor device 11 in a copper-to-copper (Cu-to-Cu) directly bonding process, and separately forming a conductive stud on an I/O pad of the second semiconductor device 12 in a hybrid bonding process, as will be discussed below.

Referring to FIG. 8A, for the first semiconductor device 11, initially a dielectric layer 161 is formed on a first surface 11a of a substrate 160 of the first semiconductor device 11 by, for example, a chemical vapor deposition (CVD) process. The first semiconductor device 11 includes I/O pads 119 at the surface 11a of the substrate 160. The dielectric layer 161 may include oxide, for example, silicon oxide (SiOx). Next, a patterned photoresist layer 162 is formed on the dielectric layer 161, exposing portions of the dielectric layer 161 through openings 168. These exposed portions correspond in position to the I/O pads 119 of the first semiconductor device 11.

Referring to FIG. 8B, the exposed portions of the dielectric layer 161 are removed by, for example, an etching process, resulting in a patterned dielectric layer 171. The patterned dielectric layer 171 exposes the I/O pads 119 through the openings 168. The patterned photoresist layer 162 is then removed.

Figure 8C:
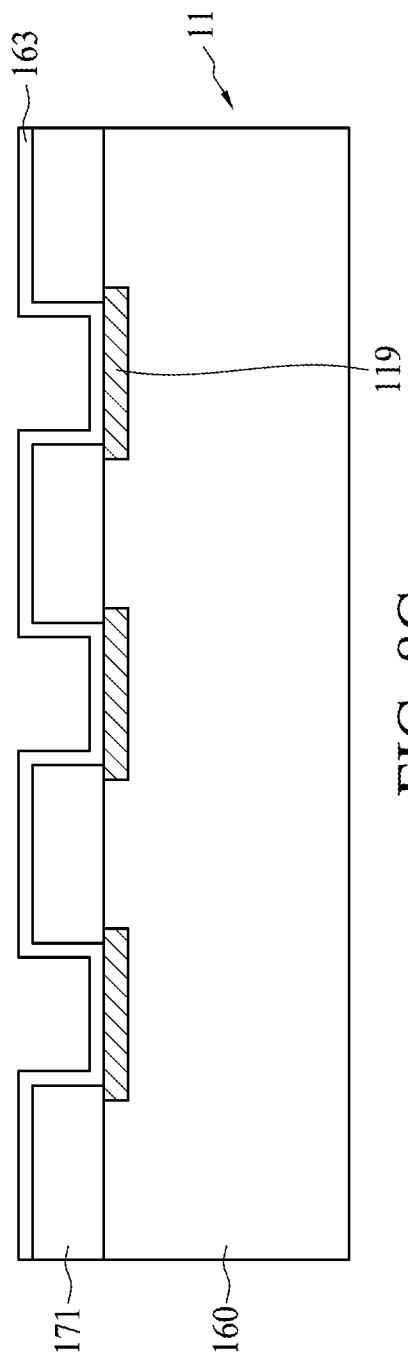

Referring to FIG. 8C, a first conductive layer 163 is formed on the patterned dielectric layer 171 and the exposed I/O pads 119 in, for example, a sputtering process. The first conductive layer 163 is substantially conformal to the topology of the patterned dielectric layer 171, and serves as a seed layer for a subsequent conductive layer to be formed thereon. In an embodiment, the first conductive layer 163 includes a titanium (Ti) layer and a copper layer stacked on the titanium layer.

Figure 8D:
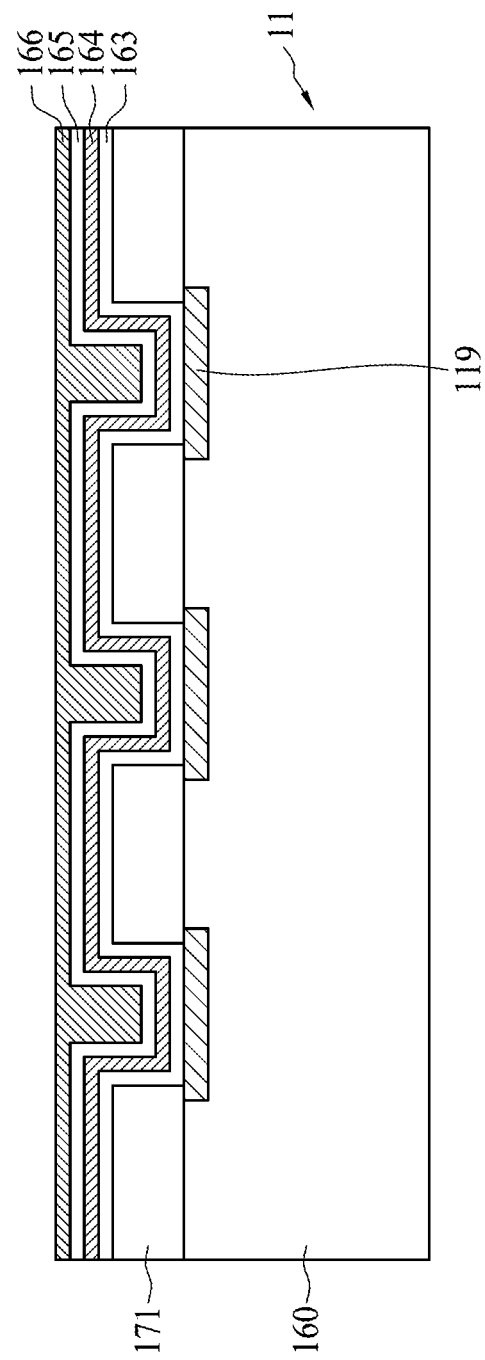

Next, referring to FIG. 8D, a second conductive layer 164, a third conductive layer 165 and a fourth conductive layer 166 are formed in sequence on the first conductive layer 163 by using, for example, a plating process. Specifically, the second conductive layer 164 is conformally formed on the first conductive layer 163, the third layer 165 is conformally formed on the second conductive layer 164, and the fourth conductive layer 166 fills up the openings 168 while being formed on the third conductive layer 165. In an embodiment, the second conductive layer 164 includes copper, the third conductive layer 165 includes nickel (Ni), and the fourth conductive layer 166 includes solder, for example, an alloy of tin and silver (SnAg). As such, the second conductive layer 164, a copper layer, ensures desirable conductivity. In addition, the fourth conductive layer 166, an SnAg layer, provides desirable fusibility that facilitates creating a bond. Moreover, the third conductive layer 165, a nickel layer, prevents electrochemical corrosion between the copper layer 164 and the SnAg layer 166 so as to ensure the desired conductivity and a robust bond.

Figure 8E:
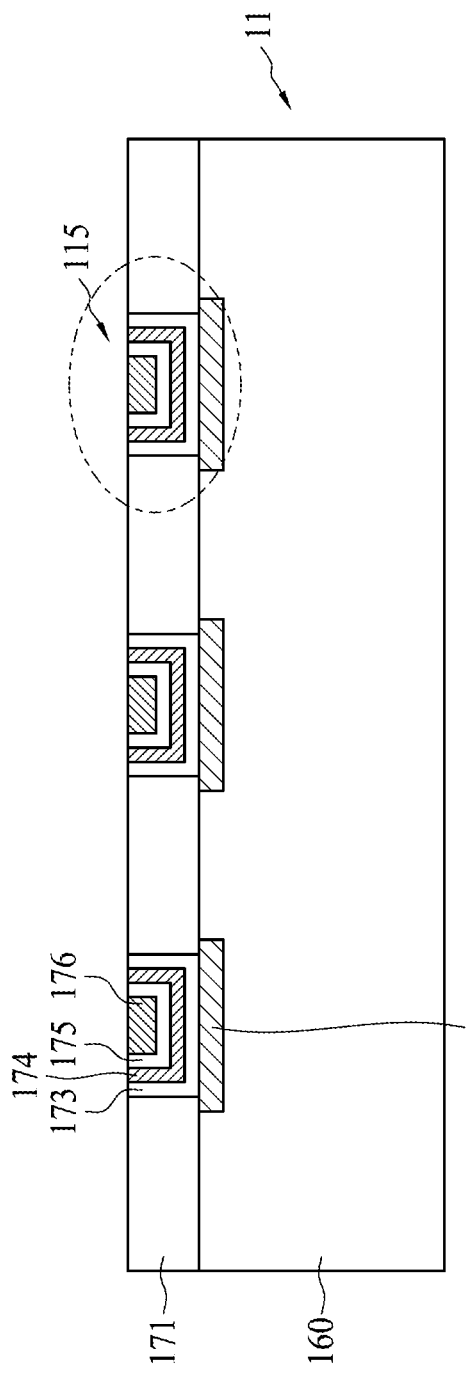

Referring now to FIG. 8E, the first, second, third and fourth conductive layers 163, 164, 165 and 166 are patterned by using, for example, a grinding process such as a chemical mechanical polishing (CMP) process, resulting in a patterned first, second, third and fourth conductive layer 173, 174, 175 and 176, which together constitute a conductive stud 115 as illustrated in FIG. 1. The patterned dielectric layer 171 is exposed and planarized after the grinding process, which facilitates bonding between the conductive stud 115 and a corresponding conductive stud 125.

Figure 8F:
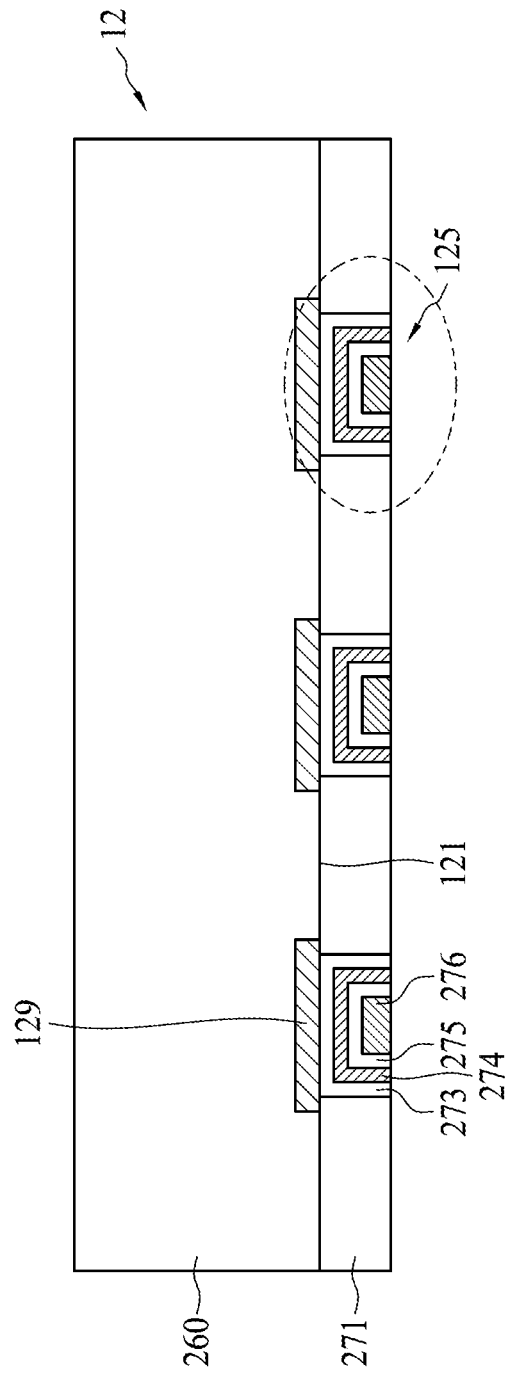

As to the second semiconductor device 12, referring to FIG. 8F, a patterned first, second, third and fourth conductive layer 273, 274, 275 and 276, which together constitute a conductive stud 125 as illustrated in FIG. 1, are formed on an I/O pad 129 at a first surface 121 of a substrate 260 of the second semiconductor device 12 in a similar fashion as described and illustrated with reference to FIGS. 8A to 8E. As a result, a patterned dielectric layer 271 on the substrate 260 is exposed and planarized.

Figure 8G:
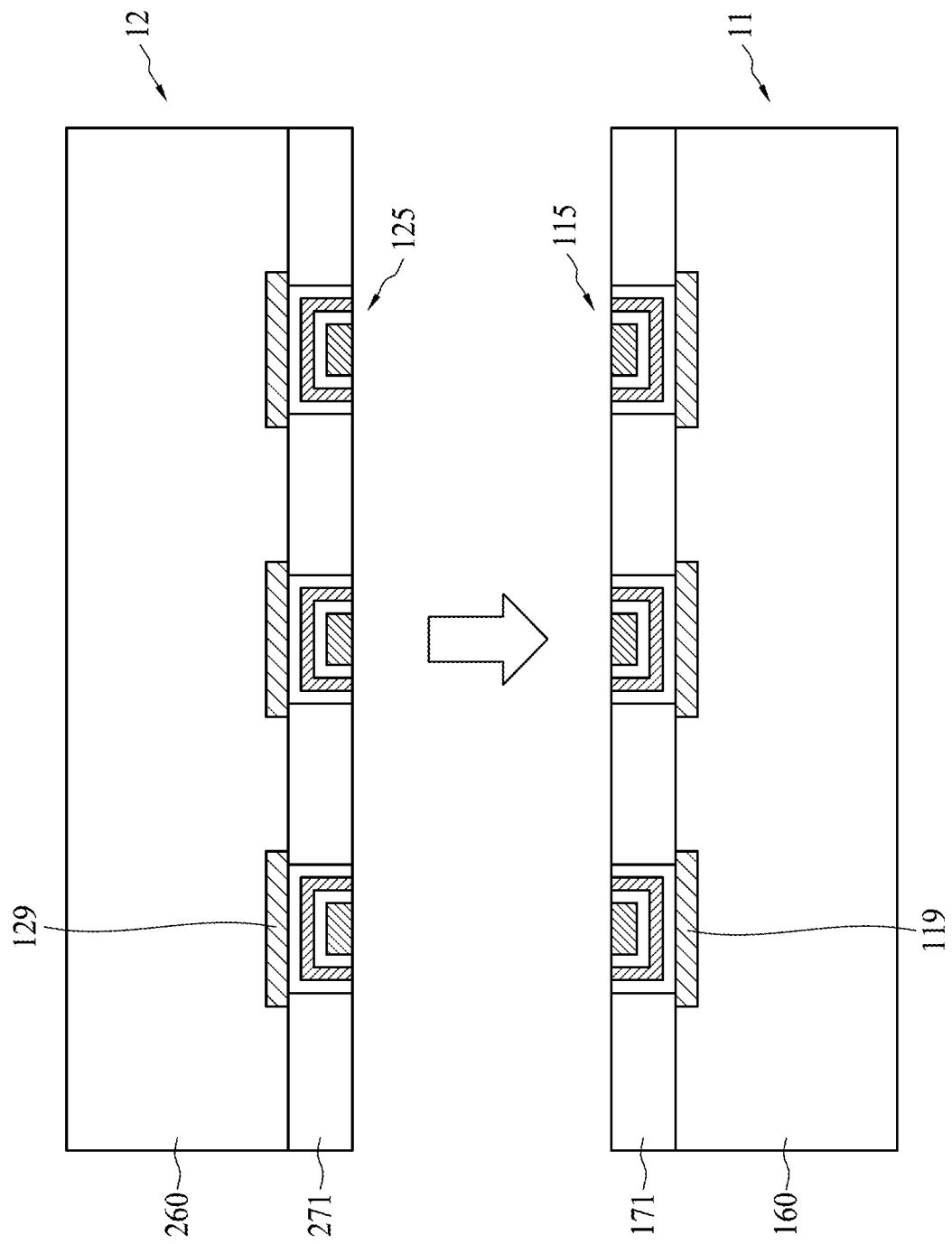
Figure 8H:
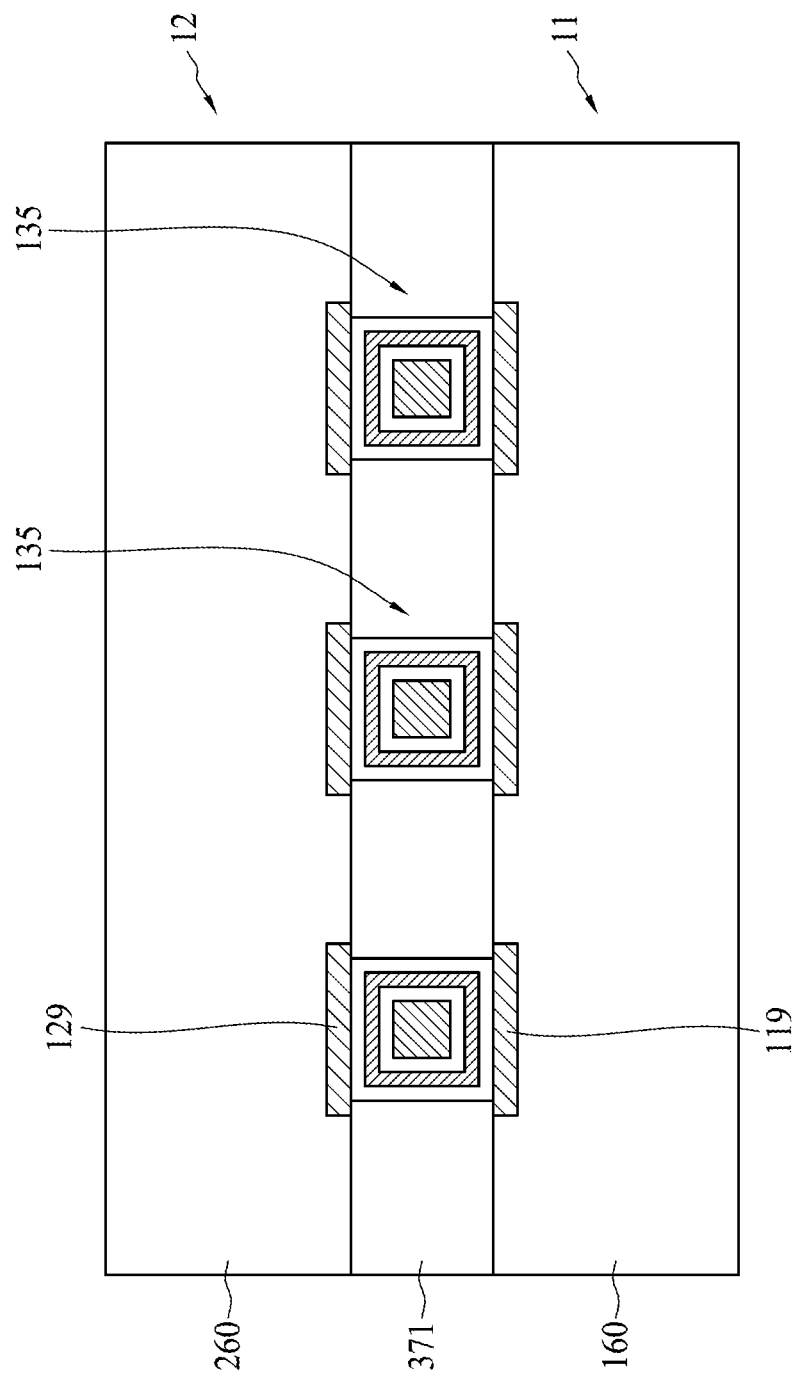

Referring to FIG. 8G, the second semiconductor device 12 is bonded to the first semiconductor device 11. Specifically, the conductive stud 125 of the second semiconductor device 12 are bonded to their corresponding conductive studs 115 of the first semiconductor device 11 in a "hybrid bonding" process. "Hybrid bonding" combines a dielectric bond with embedded metal to form an interconnection. Initially, a dielectric bond between the dielectric layers 271 and 171, when come in contact with each other, is formed by Van der Waals force at room temperature, resulting in a bonded dielectric layer 371, as illustrated in FIG. 8H. Next, a thermal process is conducted to force the patterned second conductive layers 274 and 174 to form a bonded joint 135.

The exemplary bonding process as described and illustrated with reference to FIGS. 8A to 8H may be conducted at a wafer level stage. Subsequently, a first semiconductor device 11, with a second semiconductor device 12 bonded thereto, is singulated in a wafer dicing process.

Figure 9A:
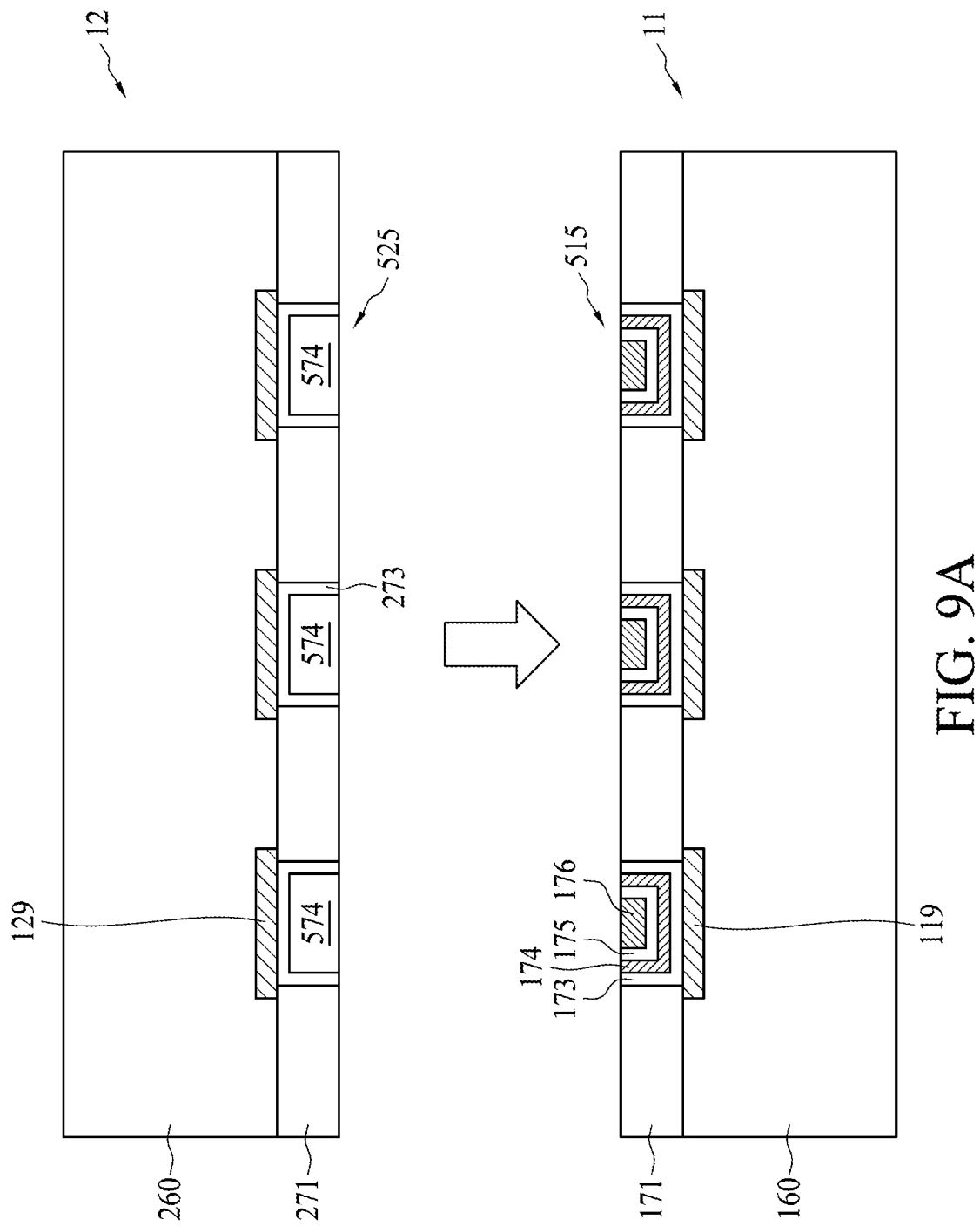
FIG. 9A is a cross-sectional view illustrating a method of forming a bonded joint between a first semiconductor device and a second semiconductor device in a semiconductor package structure in accordance with another embodiment of the present disclosure.

FIG. 9A is a cross-sectional view illustrating a method of forming a bonded joint between a first semiconductor device 11 and a second semiconductor device 12 in the semiconductor package structure 100 as described and illustrated with reference to FIG. 1, in accordance with another embodiment of the present disclosure. The method is similar to that described and illustrated with reference to FIGS. 8A through 8H except, for example, conductive studs 525 of the second semiconductor device 12. Specifically, conductive studs 515 of the first semiconductor device 11 are identical with or similar to the conductive studs 115 of FIG. 8G. The conductive studs 525 of the second semiconductor device 12 may only include the patterned first conductive layer 273 and a patterned second conductive layer 574. To form a bonded joint, similarly, a dielectric bond between the dielectric layers 271 and 171 is formed at room temperature, and subsequently a metal bond is formed by the patterned second conductive layers 174 and 574 by using a thermal process.

Figure 9B:
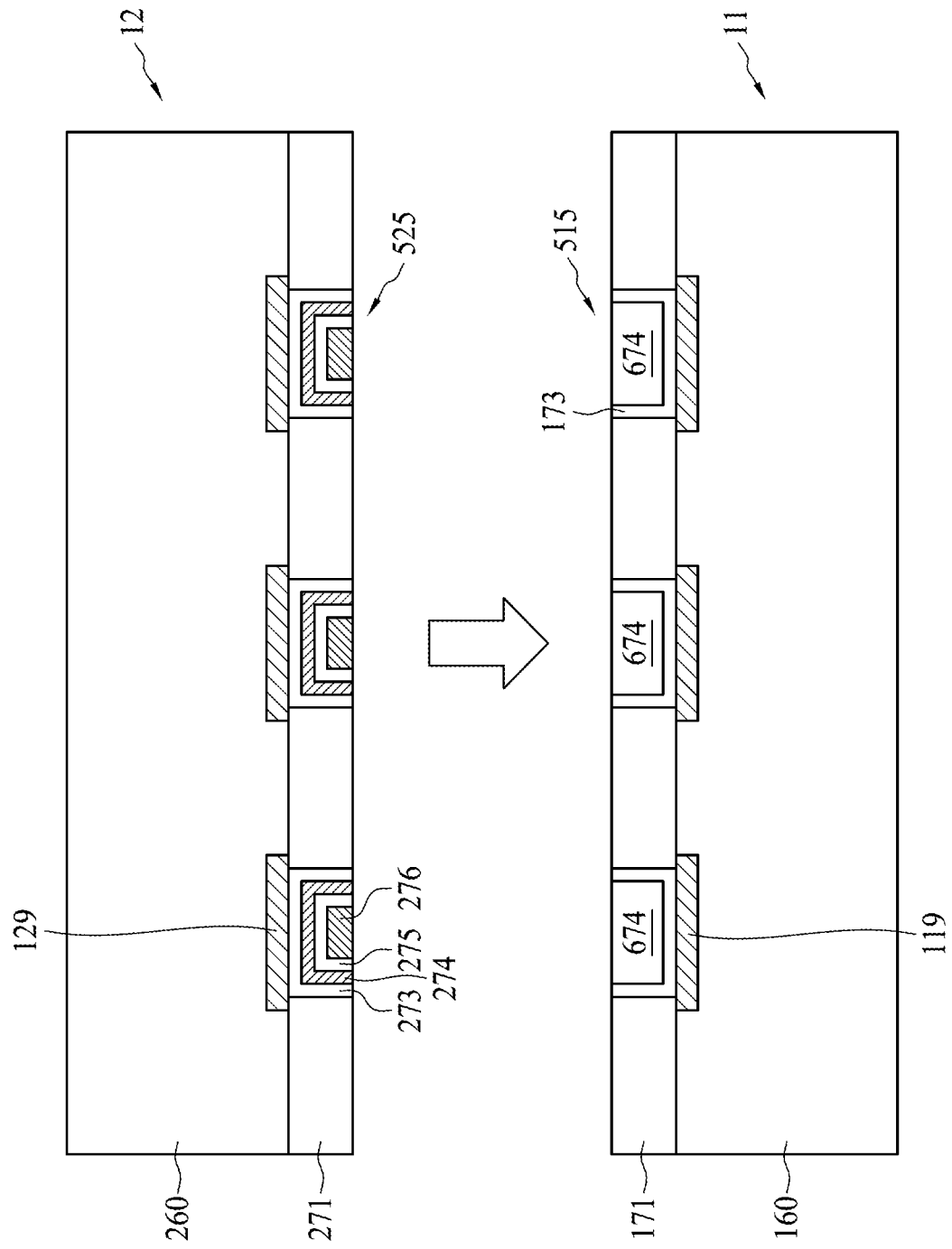
FIG. 9B is a cross-sectional view illustrating a method of forming a bonded joint between a first semiconductor device and a second semiconductor device in a semiconductor package structure in accordance with yet another embodiment of the present disclosure.

FIG. 9B is a cross-sectional view illustrating a method of forming a bonded joint between a first semiconductor device 11 and a second semiconductor device 12 in the semiconductor package structure 100 as described and illustrated with reference to FIG. 1, in accordance with yet another embodiment of the present disclosure. The method is similar to that described and illustrated with reference to FIGS. 8A through 8H except, for example, conductive studs 515 of the first semiconductor device 11. Specifically, conductive studs 525 of the second semiconductor device 12 are identical with or similar to the conductive studs 125 of FIG. 8F. The conductive studs 515 of the first semiconductor device 11 may only include the patterned first conductive layer 173 and a patterned second conductive layer 674. To form a bonded joint, similarly, a dielectric bond between the dielectric layers 271 and 171 is formed at room temperature, and subsequently a metal bond is formed by the patterned second conductive layers 674 and 274 by using a thermal process.

Figure 9C:
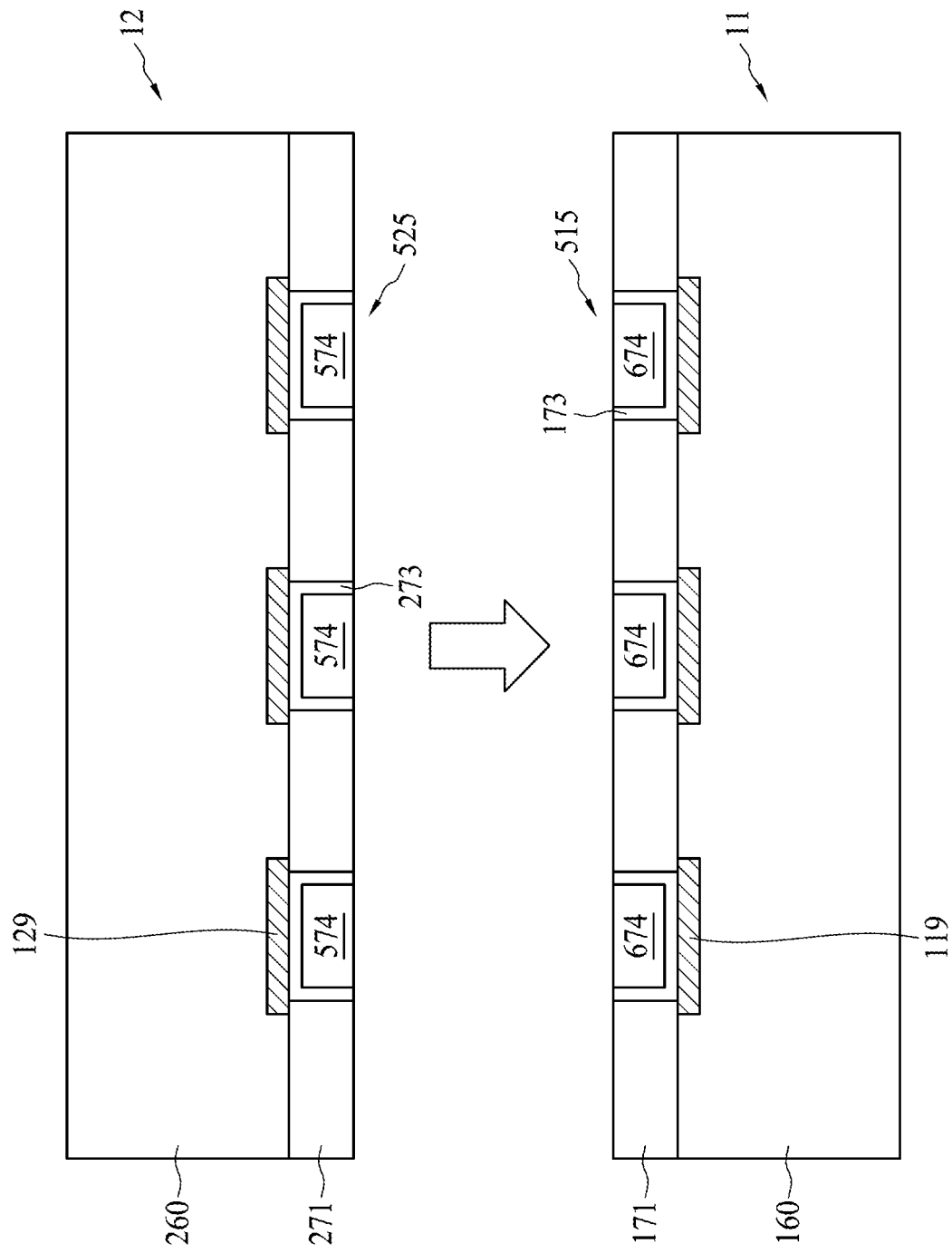
FIG. 9C is a cross-sectional view illustrating a method of forming a bonded joint between a first semiconductor device and a second semiconductor device in a semiconductor package structure in accordance with still another embodiment of the present disclosure.

FIG. 9C is a cross-sectional view illustrating a method of forming a bonded joint between a first semiconductor device 11 and a second semiconductor device 12 in the semiconductor package structure 100 as described and illustrated with reference to FIG. 1, in accordance with still yet another embodiment of the present disclosure. Referring to FIG. 9C, the conductive studs 515 of the first semiconductor device 11 may only include the patterned first conductive layer 173 and a patterned second conductive layer 674. In addition, the conductive studs 525 of the second semiconductor device 12 may only include the patterned first conductive layer 273 and a patterned second conductive layer 574. To form a bonded joint, similarly, a dielectric bond between the dielectric layers 271 and 171 is formed at room temperature, and subsequently a metal bond is formed by the patterned second conductive layers 574 and 674 by using a thermal process.

FIG. 10A through FIG. 10E are cross-sectional views each illustrating one or more stages of another method of forming a bonded joint 135 between a first semiconductor device 11 and a second semiconductor device 12 in the semiconductor package structure 100 as described and illustrated with reference to FIG. 1.

Referring to FIG. 10A, a patterned dielectric layer 181 is formed on a first surface 11a of the first semiconductor device 11 by using, for example, a photolithographic process, exposing I/O pads 119 from openings 188. The patterned dielectric layer 181 may include polyimide.

Referring to FIG. 10B, a patterned conductive layer 115 is formed on the patterned dielectric layer 181 and the conductive pads 119 by using a plating process followed by an etching process. The patterned conductive layer 115 includes conductive studs to bond with conductive studs of a second semiconductor device 12. Subsequently, referring to FIG. 10C, conductive pillars 112 are formed on I/O pads 119 in a fashion similar to forming the conductive studs 115.

Figure 10E:
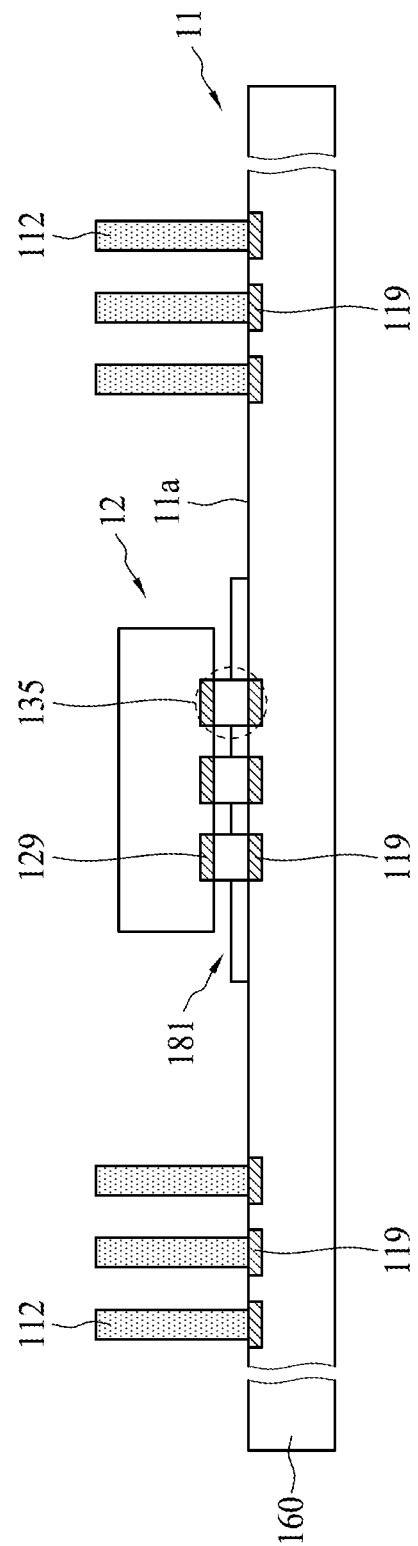

Referring to FIG. 10D, a second semiconductor device 12 is provided. The second semiconductor device 12 includes a patterned conductive layer 125 formed on a patterned dielectric layer 281 and I/O pads 129. The patterned conductive layer 125 includes conductive studs to bond with the conductive studs 115 of the first semiconductor device 11. Next, the conductive studs 125 of the second semiconductor device 12 are bonded to the conductive studs 115 of the first semiconductor device 11 with the help of, for example, solder 681, resulting in bonded joints 135 as illustrated in FIG. 10E.

FIG. 11A through FIG. 11E are cross-sectional views each illustrating one or more stages of a method of manufacturing the semiconductor package structure 200 as described and illustrated with reference to FIG. 3A, in accordance with yet another embodiment of the present disclosure.

Referring to FIG. 11A, similar to the operation described and illustrated with reference to FIG. 7C, a carrier 21 with a release film 210 is provided. Subsequently, a first semiconductor device 11 bonded with a second semiconductor device 12 is attached at a second surface 11b thereof onto the release film 210. Furthermore, a substrate 51 is attached to the release film 210. The substrate 51 may include a coreless substrate.

Figure 11C:
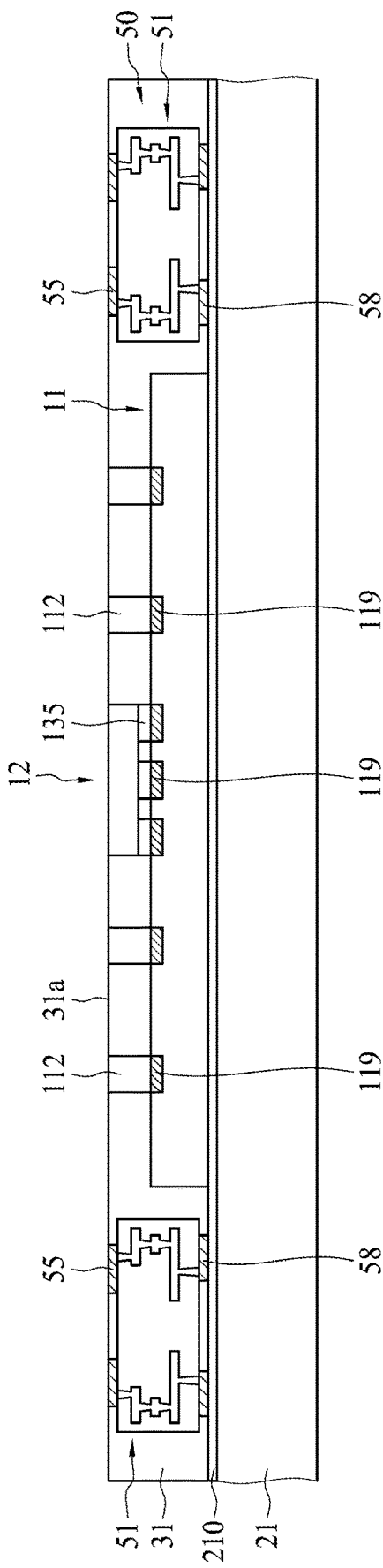

Referring to FIG. 11B, an encapsulating layer 310 is formed on the carrier 21, covering the first semiconductor device 11, the second semiconductor device 12 and the coreless substrate 51. Afterwards, referring to FIG. 11C, the encapsulating layer 310 is reduced in height by, for example, a grinding process such as a mechanical polishing process, resulting in a reduced encapsulating layer 31. The reduced encapsulating layer 31 exposes from a first surface 31a thereof the conductive pillars 112 of the first semiconductor device 11 and the upper pads 55 of the coreless substrate 51.

Figure 11D:
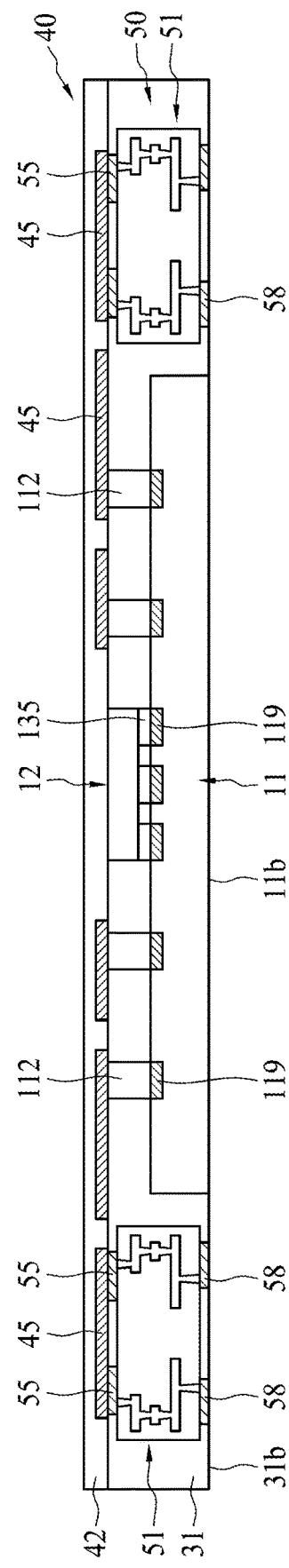

Referring to FIG. 11D, the carrier 21 together with the release film 210 is then removed, exposing from a second surface 31b of the reduced encapsulating layer 31 the second surface 11b of the first semiconductor device 11 and the lower pads 58 of the coreless substrate 51. The second surface 31b is opposite to the first surface 31a of the reduced encapsulating layer 31. Subsequently, a first redistribution structure 40 is formed on the first surface 31a of the reduced encapsulating layer 31. The first redistribution structure 40 functions to provide electrical connection and may include several dielectric layers and conductive layers. For convenience, only a dielectric layer 42 and a conductive layer 45 are shown.

Referring to FIG. 11E, a second redistribution structure 60 is formed on the second surface 31b of the reduced encapsulating layer 31 and the second surface 11b of the first semiconductor device 11. Similarly, the second redistribution structure 60 functions to provide electrical connection, and may include several dielectric layers and conductive layers. For convenience, only a dielectric layer 62 and a conductive layer 65 are shown. Suitable materials for the second dielectric layer 62 and the second conductive layer 65 are similar to or the same as those for the dielectric layer 42 and the conductive layer 45, respectively, as described with reference to FIG. 7F, and thus are not further discussed.

Next, referring back to FIG. 3A, a stack of third semiconductor devices 70 is attached on the first redistribution structure 40. The third semiconductor device 70 includes a high bandwidth memory (HBM). In addition, electrical contacts 82 are mounted on the second redistribution structure 60. Suitable materials and deployment for the electrical contacts 82 are similar to or the same as the electrical contacts 81 as described with reference to FIG. 1, and thus are not further discussed.

The semiconductor package structure 300 of FIG. 3B may be manufactured by a method similar to that described and illustrated with reference to FIGS. 11A to 11E except that, for example, in the operation of FIG. 11E a stack of third semiconductor devices 70 is attached on the second redistribution structure 60, and electrical contacts 82 are mounted on the first redistribution structure 40.

Figure 12B:
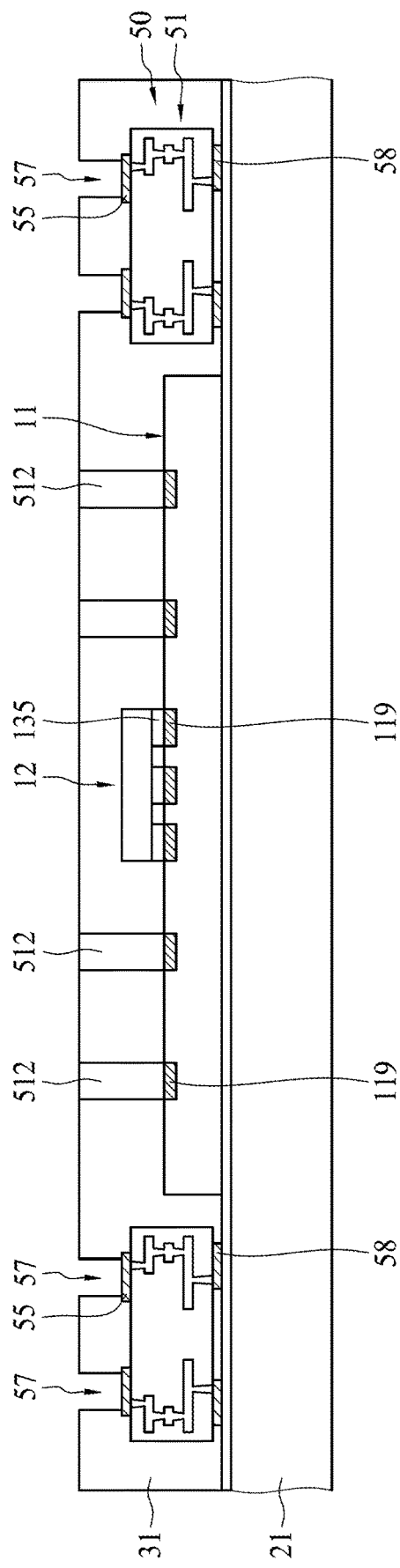
Figure 12C:
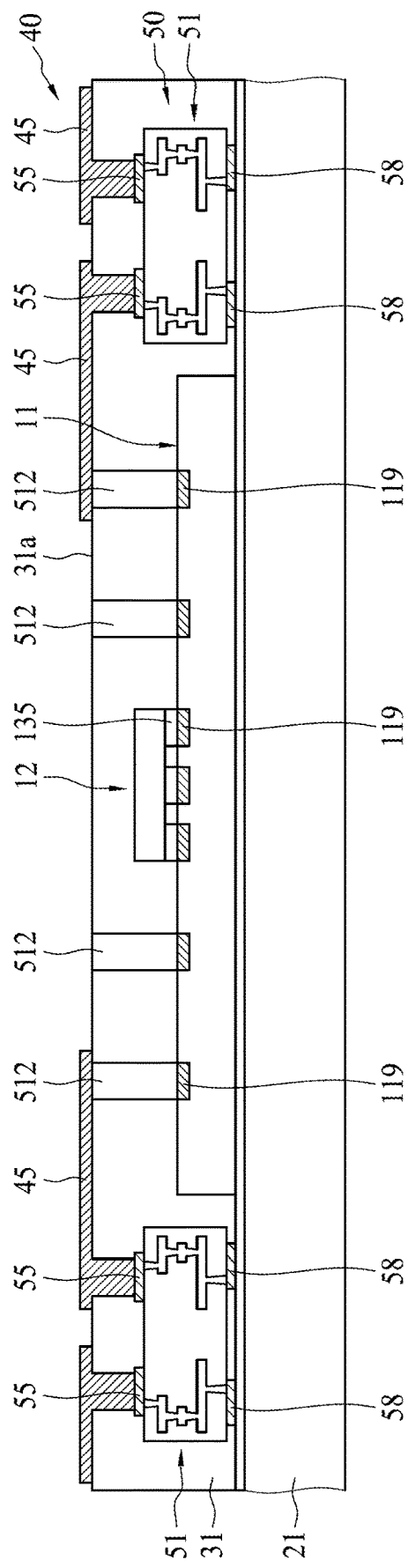

FIG. 12A through FIG. 12C are cross-sectional views each illustrating one or more stages of a method of manufacturing the semiconductor package structure 200 as described and illustrated with reference to FIG. 3A, in accordance with another embodiment of the present disclosure.

Referring to FIG. 12A, the first semiconductor device 11 is similar to that described and illustrated with reference to FIG. 3A except that, for example, conductive pillars 512 are taller than the conductive pillars 112. As a result, by setting the conductive pillars 512 as a grinding stop, after a grinding process as conducted in FIG. 11C to reduce the encapsulating layer 310, the conductive pillars 512 are exposed from the reduced encapsulating layer 31, while the coreless substrate 51 is still covered by the reduced encapsulating layer 31.

Next, referring to FIG. 12B, the reduced encapsulating layer 31 is patterned by, for example, a laser drilling process, exposing upper pads 55 of the coreless substrate 51 through openings 57.

Subsequently, referring to FIG. 12C, a first redistribution structure 40 is formed on the first surface 31a of the patterned, reduced encapsulating layer 31. During forming the first redistribution structure 40, a conductive layer 45 fills in the openings 57 and electrically connects the upper pads 55 and the conductive pillars 512. The remaining operations are similar to or the same as those described and illustrated with reference to FIGS. 11E and 3A and thus are not further discussed.

FIG. 13A through FIG. 13D are cross-sectional views each illustrating one or more stages of a method of manufacturing the semiconductor package structure 200 as described and illustrated with reference to FIG. 3A, in accordance with yet another embodiment of the present disclosure.

Figure 13A:
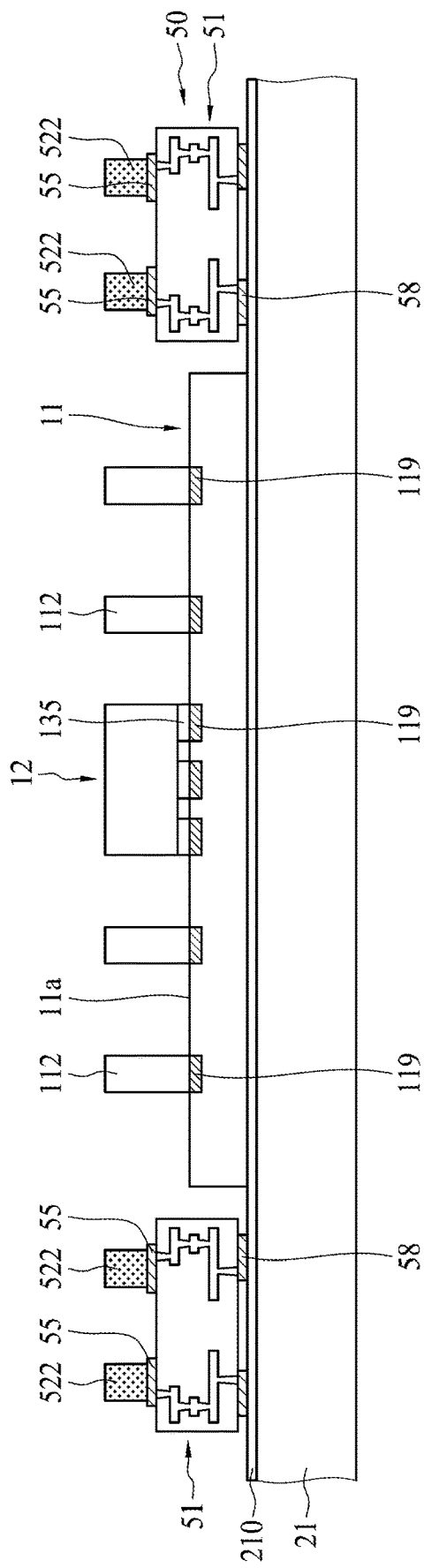
FIG. 13A through FIG. 13D are cross-sectional views each illustrating one or more stages of a method of manufacturing a semiconductor package structure in accordance with yet another embodiment of the present disclosure.

Referring to FIG. 13A, the structure is similar to that described and illustrated with reference to FIG. 11A except that, for example, additional pillars 522 are formed on the upper pads 55 of the coreless substrate 51. The additional pillars 522 of the coreless substrate 51 are substantially flush with the conductive pillars 112 of the first semiconductor device 11.

Figure 13B:
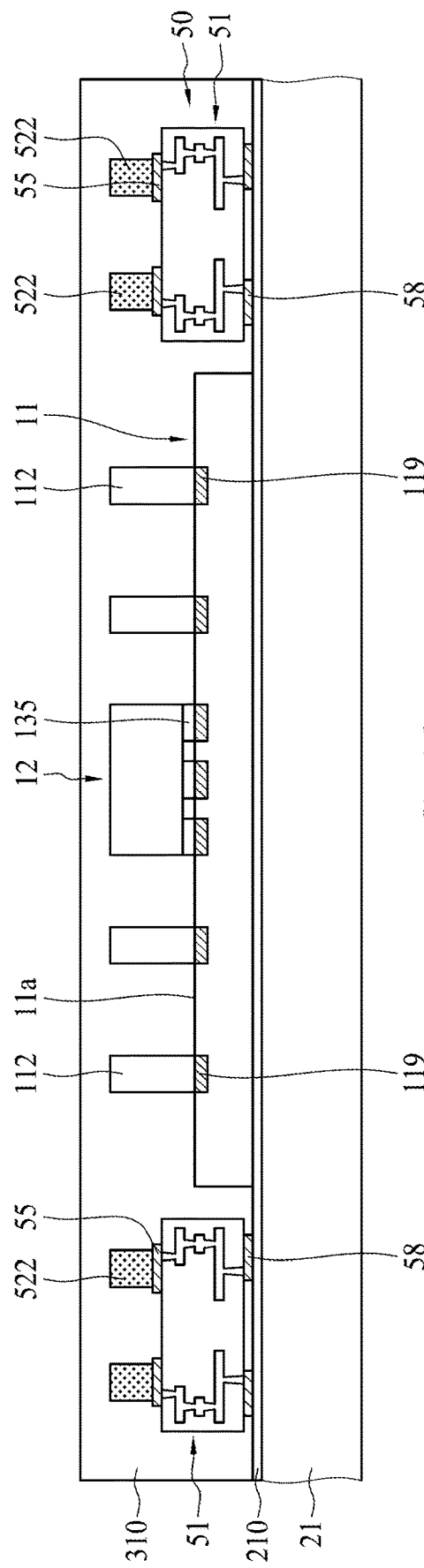
Figure 13C:
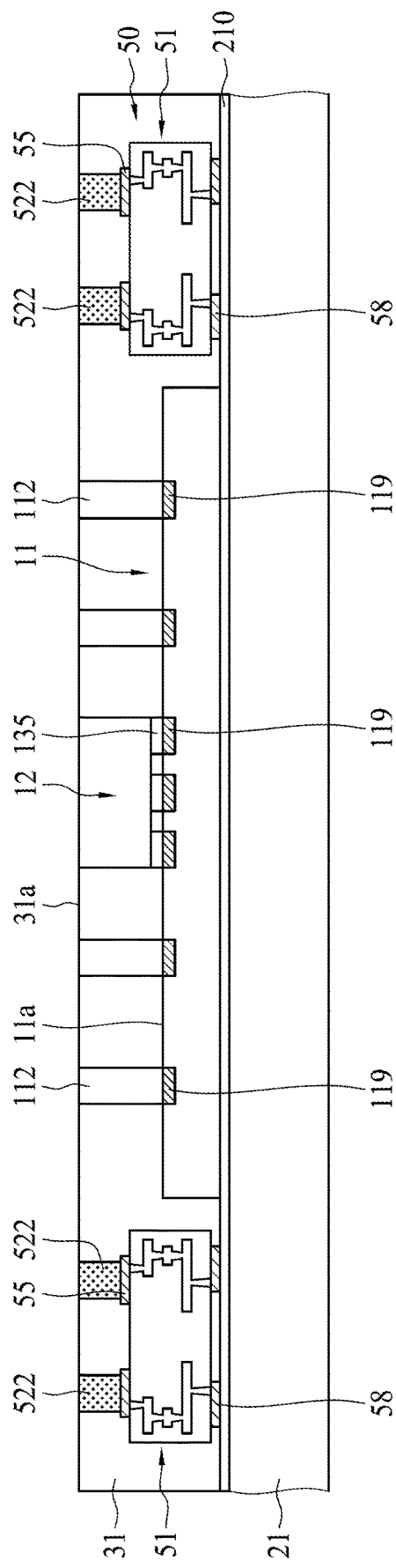

Referring to FIG. 13B, an encapsulating layer 310 is formed on the carrier 21, covering conductive pillars 112 of the first semiconductor device 11, the second semiconductor device 12 and the additional pillars 522 of the coreless substrate 51. Afterwards, referring to FIG. 13C, the encapsulating layer 310 is reduced in height by, for example, a grinding process such as a mechanical polishing process, resulting in a reduced encapsulating layer 31. The reduced encapsulating layer 31 exposes from a first surface 31a thereof the conductive pillars 112 of the first semiconductor device 11 and the additional pillars 522 of the coreless substrate 51.

Figure 13D:
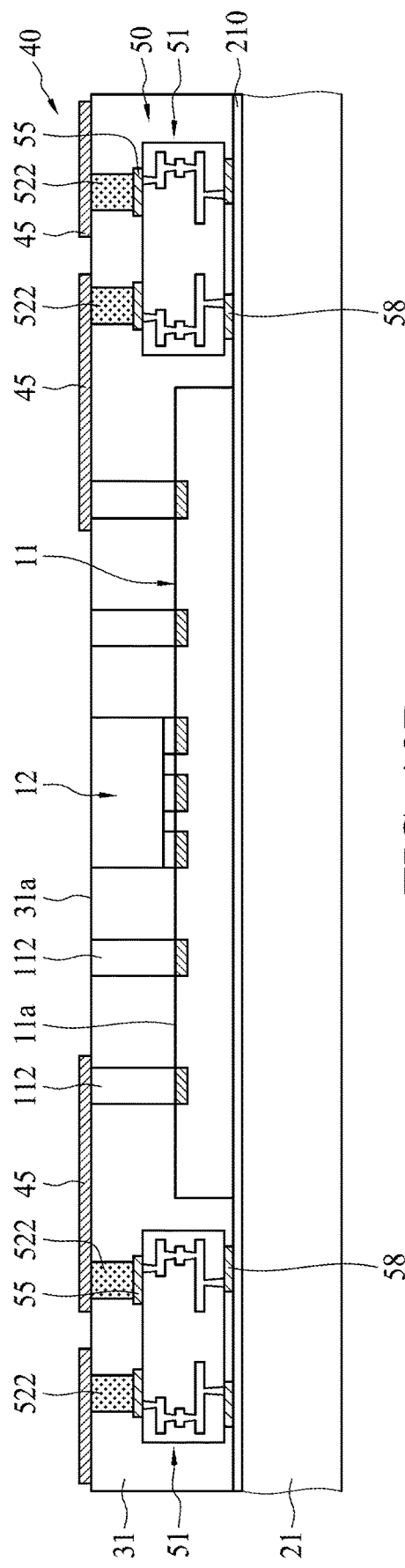

Subsequently, referring to FIG. 13D, a first redistribution structure 40 is formed on the first surface 31a of the reduced encapsulating layer 31. During forming the first redistribution structure 40, a conductive layer 45 electrically connects the additional pillars 522 of the coreless substrate 51 and the conductive pillars 112 of the first semiconductor device 11. The remaining operations are similar to or the same as those described and illustrated with reference to FIGS. 11E and 3A and thus are not further discussed.

FIG. 14A through FIG. 14J are cross-sectional views each illustrating one or more stages of a method of manufacturing the semiconductor package structure 400 as described and illustrated with reference to FIG. 5A, in accordance with an embodiment of the present disclosure.

Figure 14A:
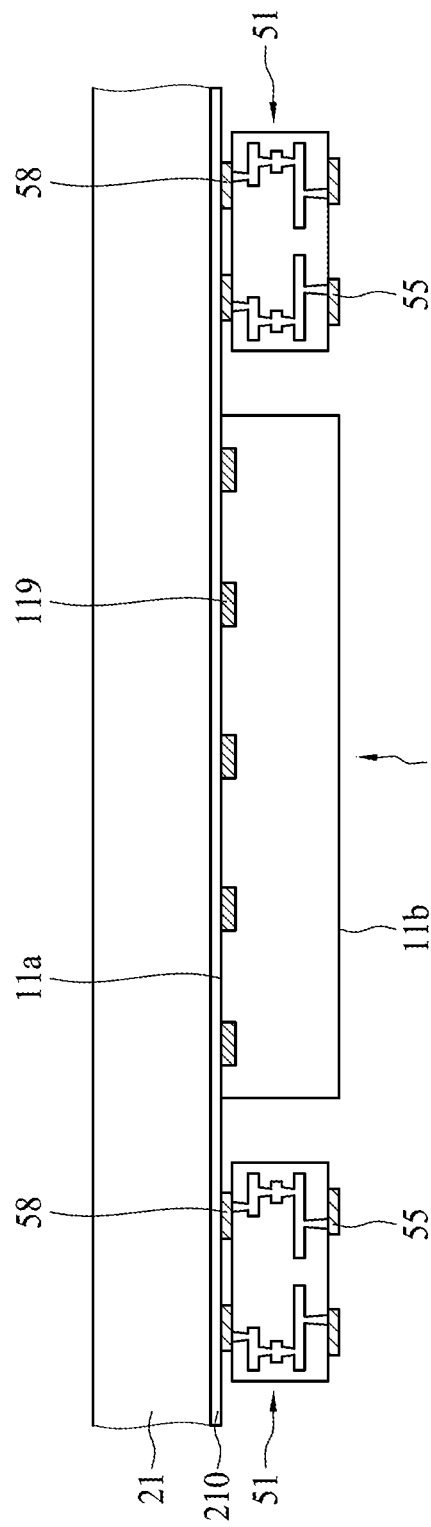

Referring to FIG. 14A, a first carrier 21 with a first release film 210 is provided. Subsequently, a first semiconductor device 11 is attached at a first surface 11a thereof onto the first release film 210. The first semiconductor device 11 includes conductive pads 119 at the first surface 11a. In addition, a coreless substrate 51 is also attached to the first release film 210. The coreless substrate 51 includes first pads 55 and second pads 58. In attaching the first semiconductor device 11, the conductive pads 119 of the first semiconductor device 11 and the second pads 58 of the coreless substrate 51 are attached to the first release film 210.

Figure 14B:
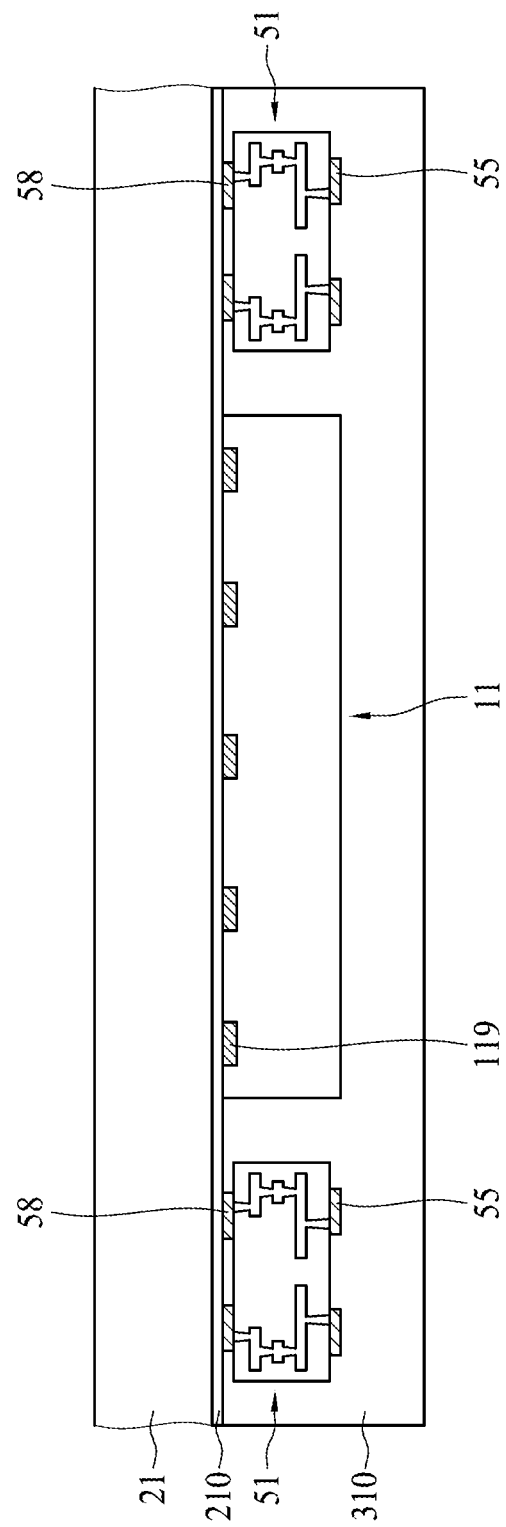

Referring to FIG. 14B, a first encapsulating layer 310 is formed on the release film 210, covering the first semiconductor device 11 and the coreless substrate 51. The first carrier 21 together with the first release film 210 is then removed, exposing the first surface 11a and the conductive pads 119 of the first semiconductor device 11, and the second pads 58 of the coreless substrate 51.

Next, referring to FIG. 14C, a first redistribution structure 40 is formed on the first surface 11a of the first semiconductor device 11. The first redistribution structure 40 includes a conductive layer 45, which further includes a first portion 451 disposed on the conductive pads 119 of the first semiconductor device 11 and a second portion 452 disposed on the second pads 58 of the coreless substrate 51. Afterwards, first pillars 812 are formed on the first portion 451 of conductive layer 45, and second pillars 822 are formed on the second portion 452 of conductive layer 45. Suitable materials for the first and second pillars 812, 822 are similar to or the same as those for the conductive pillars 112 as described with reference to FIG. 3A. Subsequently, referring to FIG. 14D, a second semiconductor device 12 is bonded to the first semiconductor device 11, forming bonded joints 135 therebetween.

Referring to FIG. 14E, the first encapsulating layer 310 is reduced in thickness by a grinding process, resulting in a reduced first encapsulating layer 31. The reduced first encapsulating layer 31 exposes the second surface 11b of the first semiconductor device 11 and the first pads 55 of the coreless substrate 51.

Then, referring to FIG. 14F, a second carrier 22 with a second release film 220 is provided. The package structure as illustrated in in FIG. 14E is attached at the second surface 11b onto the second release film 220. Thereafter, a second encapsulating layer 320 is formed on the second release film 220, covering the package structure, including the reduced first encapsulating layer 31 that seals the first semiconductor device 11 and the coreless substrate 51, and the second semiconductor device 12. The second carrier 22 together with the second release film 220 is then removed, exposing the second surface 11b and the first pads 55 of the coreless substrate 51.

Figure 14G:
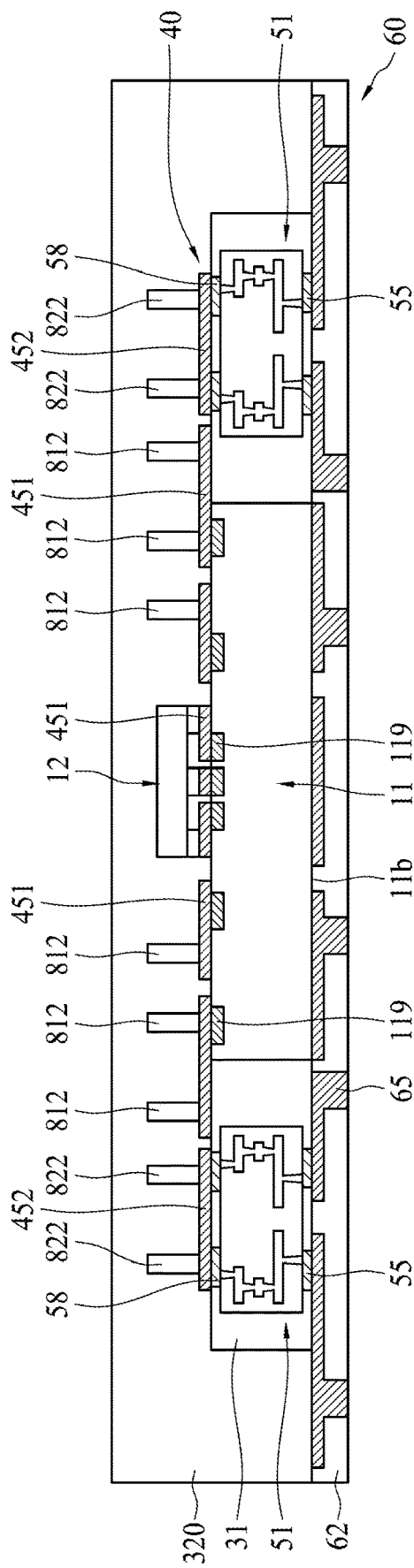

Referring now to FIG. 14G, a second redistribution structure 60 is formed on the second surface 11b of the first semiconductor device 11 and the first pads 55 of the coreless substrate 51. The second redistribution structure 60 includes a second dielectric layer 62 and a second conductive layer 65. Portions of the second conductive layer 65 form electrical connection with the first pads 55 of the coreless substrate 51.

Figure 14H:
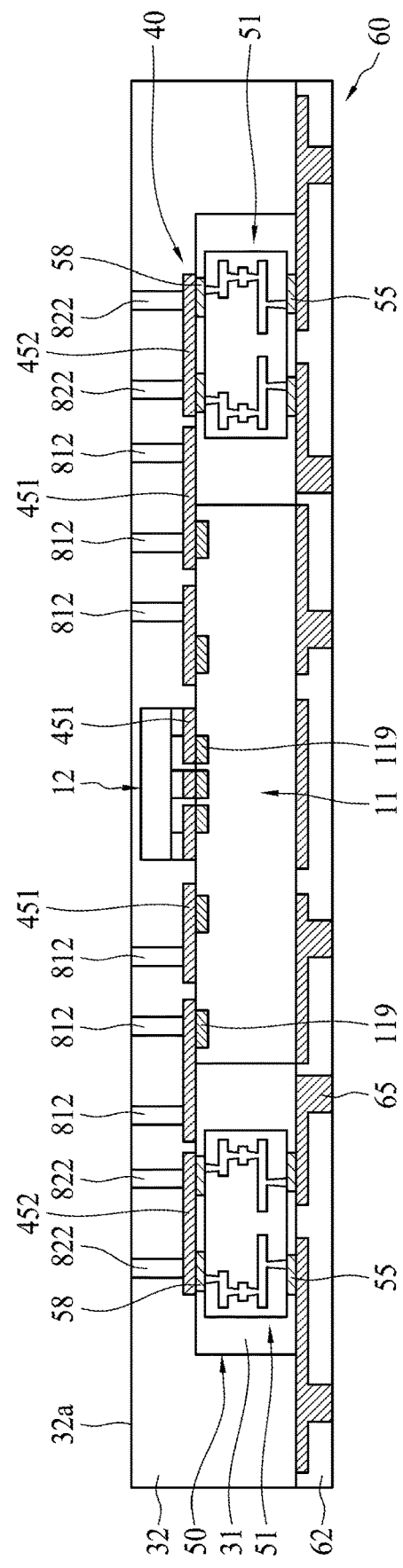

Next, referring to FIG. 14H, the second encapsulating layer 320 is reduced in height by a grinding process, resulting in a reduced second encapsulating layer 32. The reduced second encapsulating layer 32 exposes from a first surface 32a thereof the first and second conductive pillars 812, 822.

Referring to FIG. 14I, a third redistribution structure 90 is then formed on the first surface 32a of the reduced second encapsulating layer 32. The third redistribution structure 90 includes a third dielectric layer 92 and a third conductive layer 95. Portions of the conductive layer 95 form electrical connection with the first and second conductive pillars 812 and 822, which in turn are electrically connected with the first portion 451 and the second portion 452 of the conductive layer 45, respectively. Suitable materials for the third dielectric layer 92 and the third conductive layer 95 are similar to or the same as those for the dielectric layer 42 and the conductive layer 45, respectively, as described with reference to FIG. 7F.

Subsequently, referring to FIG. 14J, electrical contacts 82 are mounted on the second redistribution structure 60 for electrical connection of the first semiconductor device 11 to, for example, a PCB.

Now referring back to FIG. 5A, a stack of third semiconductor devices 70 is attached on the third redistribution structure 90. The third semiconductor device 70 includes a high bandwidth memory (HBM).

The semiconductor package structure 500 of FIG. 5B may be manufactured by a method similar to that described and illustrated with reference to FIGS. 14A to 14I except that, for example, after the operation of FIG. 14I a stack of third semiconductor devices 70 is attached on the second redistribution structure 60, and electrical contacts 82 are mounted on the first redistribution structure 40.

FIG. 15A through FIG. 15H are cross-sectional views each illustrating one or more stages of a method of manufacturing the semiconductor package structure 600 as described and illustrated with reference to FIG. 6, in accordance with an embodiment of the present disclosure.

Referring to FIG. 15A, a first carrier 21 with a first release film 210 is provided. Subsequently, a first semiconductor device 11 is attached at a first surface 11a thereof onto the first release film 210. The first semiconductor device 11 includes conductive pads 119 at the first surface 11a.

Referring to FIG. 15B, a first encapsulating layer 310 is formed on the release film 210, covering the first semiconductor device 11. The first carrier 21 together with the first release film 210 is then removed, exposing the first surface 11a and the conductive pads 119 of the first semiconductor device 11.

Figure 15C:
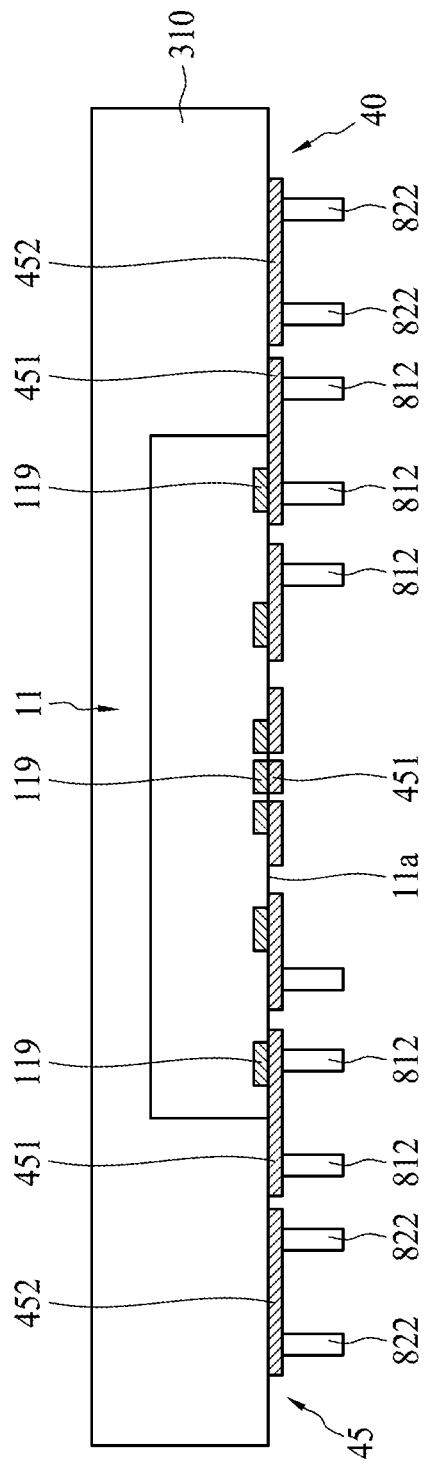
Figure 15D:
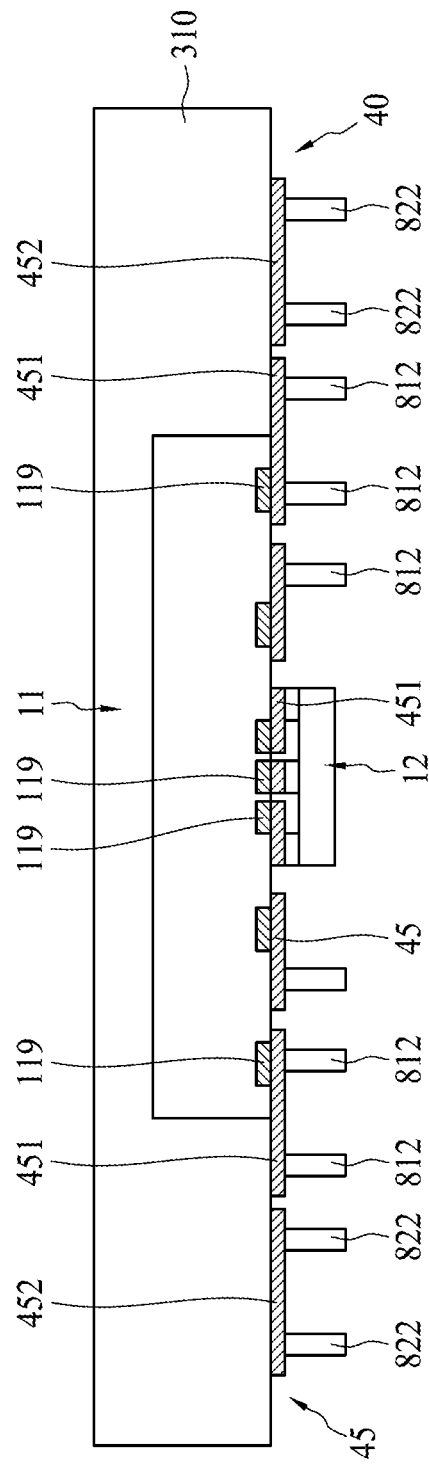

Next, referring to FIG. 15C, a first redistribution structure 40 is formed on the first surface 11a of the first semiconductor device 11. The first redistribution structure 40 includes a conductive layer 45, which further includes a first portion 451 and a second portion 452 separate from the first portion 451. Thereafter, first and second conductive pillars 812, 822 are formed on the conductive layer 45 to provide electrical connection for the conductive pads 119 of the first semiconductor device 11. Subsequently, referring to FIG. 15D, a second semiconductor device 12 is bonded to the first semiconductor device 11.

Figure 15E:
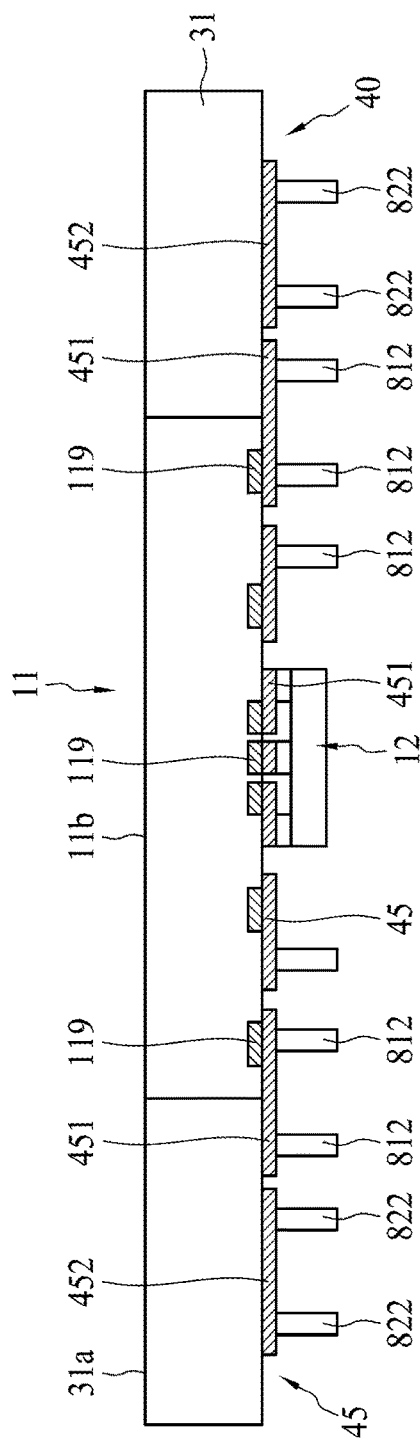

Referring to FIG. 15E, the first encapsulating layer 310 is reduced in thickness by a grinding process, resulting in a reduced first encapsulating layer 31. The reduced first encapsulating layer 31 exposes a second surface 11b of the first semiconductor device 11 and the first surface 31a of the reduced first encapsulating layer 31.

Figure 15F:
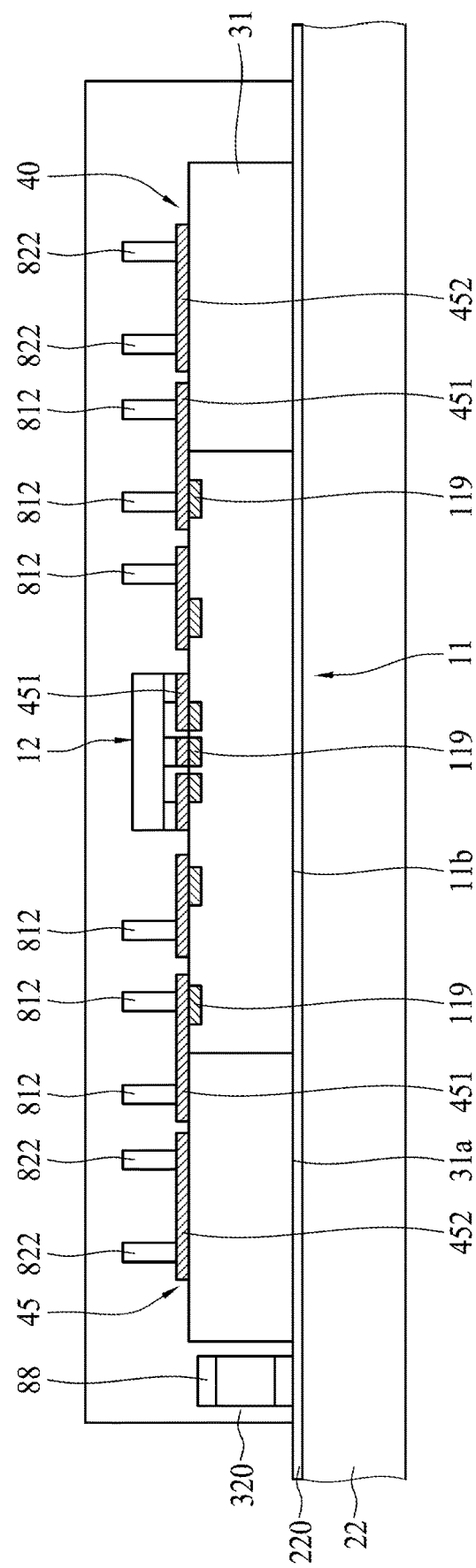

Next, referring to FIG. 15F, a second carrier 22 with a second release film 220 is provided. The package structure as illustrated in in FIG. 15E is attached at the second surface 11b onto the second release film 220. Optionally, a passive device 88 such as an inductor may also be attached onto the second release film 220. Thereafter, a second encapsulating layer 320 is formed on the second release film 220, covering the passive device 88, if any, the package structure including the reduced first encapsulating layer 31 that seals the first semiconductor device 11, and the second semiconductor device 12. After the second encapsulating layer 320 is formed, the second carrier 22 together with the second release film 220 is removed, exposing the second surface 11b and the first surface 31a of the reduced first encapsulating layer 31.

Figure 15G:
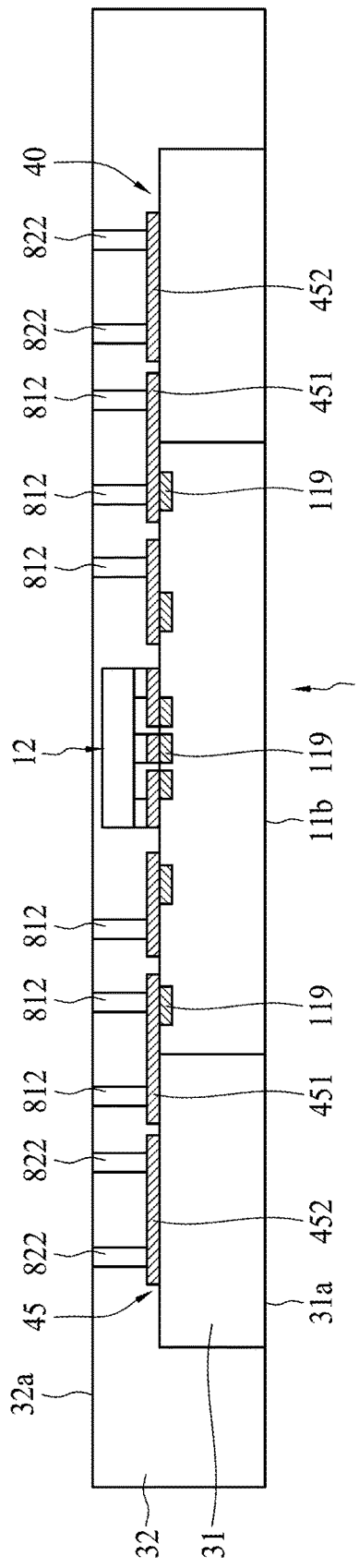

Referring to FIG. 15G, the second encapsulating layer 320 is reduced in height by a grinding process, resulting in a reduced second encapsulating layer 32. The reduced second encapsulating layer 32 exposes from a first surface 32a thereof the first and second conductive pillars 812, 822.

Figure 15H:
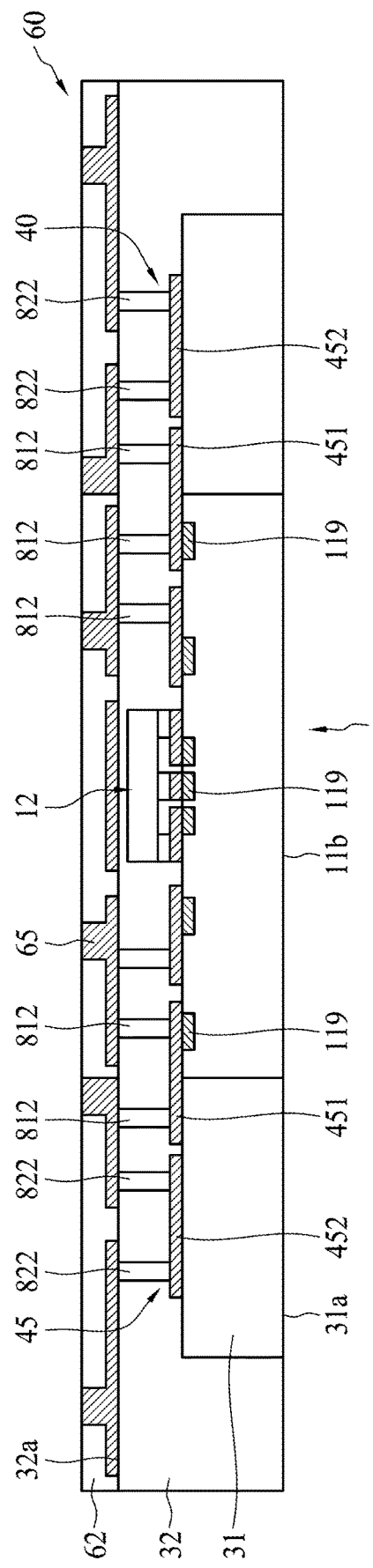

Subsequently, referring to FIG. 15H, a second redistribution structure 60 is formed on the first surface 32a of the reduced second encapsulating layer 32. The second redistribution structure 60 includes a second dielectric layer 62 and a second conductive layer 65. Portions of the second conductive layer 65 form electrical connection with the first and second conductive pillars 812 and 822.

Now referring back to FIG. 6, electrical contacts 82 are mounted on the second redistribution structure 60. The second redistribution structure 60 and the electrical contacts 82 function to provide electrical connection of the first semiconductor device 11 to, for example, a PCB.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
a first semiconductor device having an active surface;
a redistribution structure in electrical connection with the first semiconductor device;
a second semiconductor device bonded to the active surface of the first semiconductor device, and disposed between the first semiconductor device and the redistribution structure; and
a plurality of conductive elements over the active surface of the first semiconductor device and outside the second semiconductor device, wherein the first semiconductor device is electrically connected to the redistribution structure via the conductive elements;
an encapsulating layer sealing the first semiconductor device, wherein the redistribution structure is disposed on the encapsulating layer; and
a substrate surrounding the first semiconductor device and the second semiconductor device, wherein the substrate includes a coreless substrate, which includes a first conductive pad disposed adjacent to a first surface of the encapsulating layer and in electrical connection with the redistribution structure.

2. The semiconductor package structure of claim 1, further comprising a first additional redistribution structure on a second surface of the encapsulating layer, the second surface opposite to the first surface of the encapsulating layer.

3. The semiconductor package structure of claim 2, wherein the coreless substrate includes a second conductive pad disposed adjacent to the second surface of the encapsulating layer and in electrical connection with the first additional redistribution structure.

4. The semiconductor package structure of claim 2, wherein the first semiconductor device includes a digital processing device, and the second semiconductor device includes a decoupling capacitor, wherein the semiconductor package structure further comprises a third semiconductor device disposed on the redistribution structure, wherein the third semiconductor device includes a memory device.

5. The semiconductor package structure of claim 2, wherein the first semiconductor device includes a digital processing device, and the second semiconductor device includes a decoupling capacitor, wherein the semiconductor package structure further comprises a third semiconductor device disposed on the first additional redistribution structure, wherein the third semiconductor device includes a memory device.

6. The semiconductor package structure of claim 2, further comprising an additional encapsulating layer sealing the first semiconductor device, and wherein the first semiconductor device is sealed together with the second semiconductor device by the encapsulating layer, the additional encapsulating layer having a first surface and a second surface opposite to the first surface thereof.

7. The semiconductor package structure of claim 6, further comprising a second additional redistribution structure, which is disposed on the first surface of the additional encapsulating layer, and includes a conductive layer that further includes a first portion at the active surface of the first semiconductor device, and a second portion on the substrate.

8. The semiconductor package structure of claim 7, further comprising first conductive pillars on the first portion of the conductive layer for electrical connection between the redistribution structure and the second additional redistribution structure.

9. The semiconductor package structure of claim 7, further comprising second conductive pillars on the second portion of the conductive layer for electrical connection between the substrate and the second additional redistribution structure.

10. The semiconductor package structure of claim 6, wherein a plurality of conductive pads of the first semiconductor device are arranged at a finer pitch than a plurality of conductive studs of the second semiconductor device.

11. The semiconductor package structure of claim 1, wherein the first semiconductor device includes conductive studs, and the second semiconductor device includes conductive studs directly contacting the conductive studs of the first semiconductor device.

12. The semiconductor package structure of claim 1, further comprising electrical contacts on a conductive layer of the redistribution structure.

13. A method of manufacturing a semiconductor package structure, the method comprising:
providing a first semiconductor device having an active surface;
forming a plurality of conductive elements over the active surface of first semiconductor device;
bonding a second semiconductor device to the active surface of the first semiconductor device, wherein the conductive elements are disposed outside the second semiconductor device;
forming a redistribution structure in electrical connection with the first semiconductor device via the conductive elements, wherein the second semiconductor device is disposed between the first semiconductor device and the redistribution structure;
sealing the first semiconductor device in a first encapsulating layer, wherein the redistribution structure is formed on a first surface of the first encapsulating layer; and
sealing the first encapsulating layer, the second semiconductor device, and the conductive elements in a second encapsulating layer.

14. A method of manufacturing a semiconductor package structure, the method comprising:
providing a first semiconductor device having an active surface;
forming a plurality of conductive elements over the active surface of first semiconductor device;
bonding a second semiconductor device to the active surface of the first semiconductor device, wherein the conductive elements are disposed outside the second semiconductor device;
forming a redistribution structure in electrical connection with the first semiconductor device via the conductive elements, wherein the second semiconductor device is disposed between the first semiconductor device and the redistribution structure; and
providing an interposer surrounding the first semiconductor device and the second semiconductor device, wherein the first semiconductor device includes a digital processing device, and the second semiconductor device includes a decoupling capacitor, further comprising providing a third semiconductor device on the redistribution structure, wherein the third semiconductor device includes a memory device.

* * * * *